United States Patent [19]

Yu et al.

[11] Patent Number: 5,140,325

[45] Date of Patent: Aug. 18, 1992

[54] SIGMA-DELTA ANALOG-TO-DIGITAL CONVERTERS BASED ON SWITCHED-CAPACITOR DIFFERENTIATORS AND DELAYS

[75] Inventors: Tsai-Chung Yu, Taipei; Yie-Yuan Shien, Yuan-Kan Hsiang; Chung-Yu Wu, Hsin-Chu; Tung-Kwan Lin, Hsinchu, all of Taiwan

[73] Assignee: Industrial Technology Research Institute, Hsinchu, Taiwan

[21] Appl. No.: 699,893

[22] Filed: May 14, 1991

[51] Int. Cl.$^5$ ............................................. H03M 3/00
[52] U.S. Cl. ................................... 341/143; 341/172; 333/173
[58] Field of Search ................... 341/143, 155, 172; 330/9, 107; 333/173

[56] References Cited

U.S. PATENT DOCUMENTS

| | | | |
|---|---|---|---|
| 4,453,143 | 6/1984 | Bennett | 333/173 X |
| 4,600,904 | 7/1986 | Shumaker | 333/173 |
| 4,692,737 | 9/1987 | Stikvoort et al. | 341/143 |
| 4,704,600 | 11/1987 | Uchimura et al. | 341/143 |
| 4,862,121 | 8/1989 | Hochschild et al. | 333/173 |
| 4,920,544 | 4/1990 | Endo et al. | 341/143 X |
| 4,970,703 | 11/1990 | Hariharan et al. | 364/861 X |

OTHER PUBLICATIONS

Norsworthy; "Oversampled Sigma-Delta Data Converters"; ISCAS '90 Workshop; 30 Apr. 1990; New Orleans, La.

Temes et al.; "A Tutorial Discussion of an Oversampling Method for A/D and D/A Conversion", IEEE International Symposium on Circuits and Systems, May 1990, pp. 910-913.

Yu et al., "Realizations of IIR/FIR and N-Path Filters Using a Novel Switch Capacitor Technique", IEEE Transaction on Circuits and Systems, Jan. 1990, vol. 37, No. 1, pp. 91-106.

Wu et al., "Realizations of FIR and IIR Filters Using SC Differentiators", in Proc. Symp. on VLSI Circuits, Japan 1988, pp. 99-100.

Primary Examiner—Howard L. Williams
Attorney, Agent, or Firm—George O. Saile

[57] ABSTRACT

Sigma-delta analog to digital converters based upon switched capacitor delay and switched capacitor differentiator circuits are described. These switched capacitor circuits have the advantages that they are less sensitive to clock feed-through noise, dc offset voltage and power supply voltage, etc. Design examples of one-bit second-order sigma-delta analog digital converter are given to substantiate both design methodology, circuit features and the utility of these new circuit structures.

36 Claims, 20 Drawing Sheets

SIGMA-DELTA ANALOG-TO-DIGITAL CONVERTERS BASED ON SWITCHED-CAPACITOR DIFFERENTIATORS AND DELAYS

FIELD OF THE INVENTION

This invention relates to circuits and analog-to-digital converters suitable for MOS technology, especially for use in analog signal processing, employing switched capacitor circuits.

REFERENCES

[1] G. C. Temes and J. C. Candy, "A tutorial discussion of the oversampling method for A/D and D/A conversion," IEEE International Symposium on Circuits and Systems, pp. 910-913, May 1990.

[2] S. R. Norsworthy, "Oversampled sigma-delta data converters," Lecture Note, IEEE ISCAS'90 workshop, May 1990.

[3] Tsai-Chung Yu, et al., "Realizations of IIR/FIR and N-path filters using a novel switched-capacitor technique," IEEE Trans. Circuits and Systems, vol. 37, no. 1, pp. 91-106, 1990.

[4] Chung-Yu Wu, et al., "Realization of FIR and IIR filters using SC differentiators," in Proc. Symp. on VLSI Circuits, Japan, pp. 99-100, 1988.

[5] Tsai-Chung Yu, et al., "New architecture for $\Sigma$-$\Delta$ analog-to-digital converter," to be presented in IEEE International Symposium on Circuits And Systems (IS-CAS'91), Singapore, Jun. 11-14, 1991.

[6] Yie-Yuan Shieu, et al., "New structure of oversampling converters," to be presented in IEEE ISCAS'91, Singapore, Jun. 11-14, 1991.

BACKGROUND OF THE INVENTION

The sigma-delta principle allows a realization of analog-to-digital converters with a high dynamic range in a standard MOS process without excessive component matching requirements. In sigma-delta ADC, high resolution is obtained by choosing a large ratio between the sampling frequency and the maximum input frequency and using a low-bit D/A converter and a noise shaping filter. These converters are ideal for combination with digital systems, thus sigma-delta analog-digital converters (ADC) are widely and deeply used in many VLSI applications, particularly telecommunications and audio [1]-[2]. However, these conventional sigma-delta ADC structures are all based on switched-capacitor (SC) integrators. In addition, many improved structures are also based on SC integrators to obtain different performance feature with some certain conditions. Compared to SC integrator, little attention has been paid to applying SC differentiators in delta-sigma ADC architecture. This main reason is that the monolithic switched-capacitor differentiators were proposed by [3]-[4] until recent years. New architectures of sigma-delta ADC which are based on SC delays and SC differentiators are constructed and proposed. Their basic elements, SC delays and SC differentiators are also given here. Introducing SC delay and SC differentiator circuits into sigma-delta ADC design, thus, open up many new architectures and create new circuit structures.

SUMMARY OF THE INVENTION

In this invention, some sigma-delta analog-digital converters based on switched-capacitor (SC) delay and SC differentiator are constructed and proposed. Because the circuit structures of these basic elements which are SC delays and differentiators adopt "return to zero" type to realize the differentiation function and delay function, thus some circuit advantages can be obtained in these SC circuits. For example, they are much less sensitive to clock feed-through noise, dc offset voltage, and power supply voltage, etc. [3],[4]. The "return to zero" type of these circuits also make themselves in applying into delta-sigma ADC have a relaxed specifications in the design of operational amplifier. In addition, these SC delays and differentiators are compatible with SC integrators with clock operation scheme and fabrication processes, so these sigma-delta analog-digital converters can also be incorporated with SC integrators to implement other sigma-delta analog-digital converters with more design flexibility and freedom [5], [6]. Some design examples of one-bit second-order sigma-delta analog digital converter are given to substantiate both design methodology, circuit features and the utility and novelty of these new circuit structures. Good performance of simulation responses confirms the correct operation of the proposed structures.

BRIEF DESCRIPTION OF THE DRAWING

In order that the invention may be more clearly understood, it will now be disclosed in greater detail with reference to the accompanying drawing, wherein:

FIG. 25 Simulated response of FIG. 23 with signal-to-noise (SNR) ratio as a function of input signal level;

DETAILED DISCLOSURE OF THE INVENTION

(1) Conventional Structures

In order that the invention may be more clearly understood, in this section, some conventional sigma-delta analog-to-digital converters (ADCs) are again shown in FIGS. 1 and 2. Thus the implementation method and circuit structures of conventional sigma-delta ADCs can be seen and understood easily, then the utility and novelty of our invention also be rapidly understood through some explanations in the later sections.

Figure 1A:
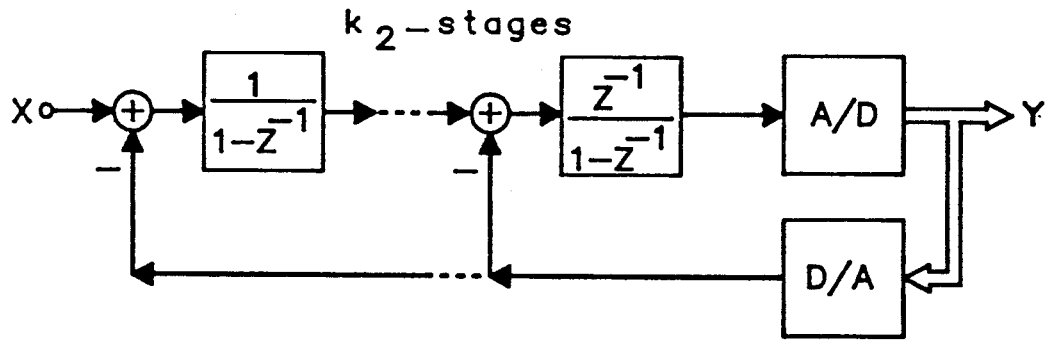
FIG. 1(a) The signal flow graph diagram of a conventional sigma-delta analog-to-digital converter.
Figure 1B:
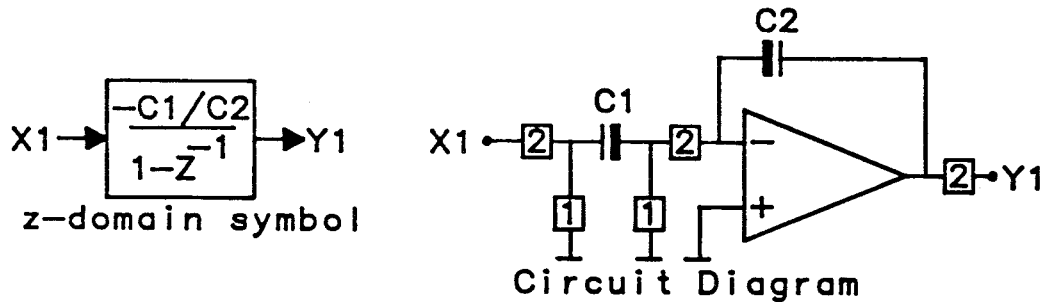
FIG. 1(b) Symbol and circuit diagram of backward-mapping SC integrator.
Figure 1C:
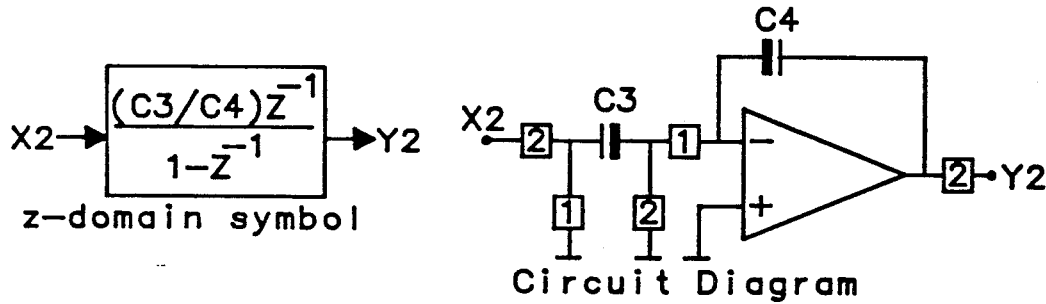
FIG. 1(c) Symbol and circuit diagram of forward-mapping SC integrator.
Figure 1D:
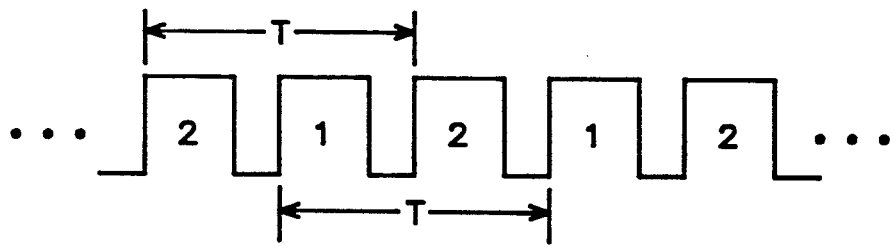
FIG. 1(d) Non-overlapping control signals of SC integrators.

FIG. 1(a) is a typical signal flow graph diagram of a $k_2$-order delta-sigma ADC and it is characterized by the transfer relation $$Y = XZ^{-1} + Q(1-Z^{-1})^{k_2} \tag{1}$$

where Q is the quantization error when the signal through the A/D circuit in the FIG. 1(a) [2]. The Z-domain model of $1/1-Z^{-1}$, $Z^{-1}/1-Z^{-1}$ in FIG. 1(a) can be realized by the use of FIG. 1(b) and FIG. 1(c), respectively. The clock operation scheme of FIG. 1(b) and 1(c) is shown in FIG. 1(d). Thus the signal flow graph diagram of FIG. 1(a) can be achieved directly by using switched-capacitor (SC) integrators.

Figure 2A:
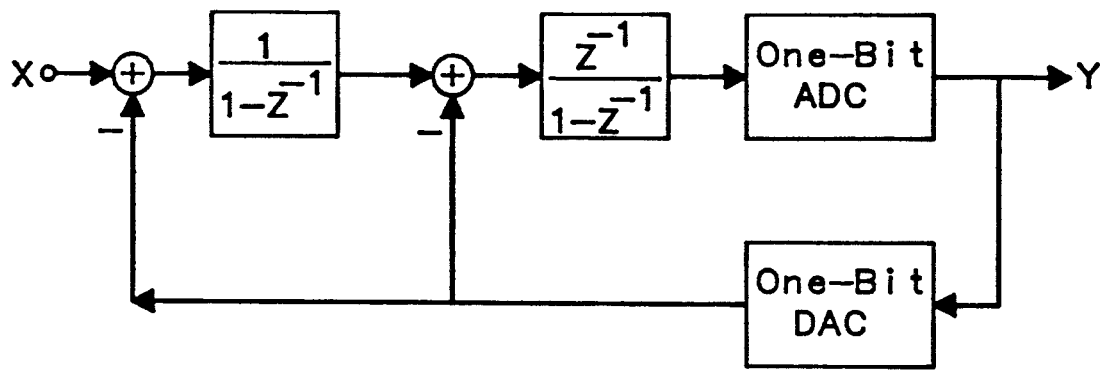
FIG. 2(a) Signal flow graph (SFG) diagram of a second-order one-bit sigma-delta ADC. The basic elements of this structure are SC integrators.

As an illustration, a second-order one-bit sigma-delta ADC based on SC integrator is adopted to provide a practical design example. FIG. 2(a) is the signal flow graph (SFG) diagram of this second-order one-bit sigma-delta ADC which is conducted from FIG. 1(a). In this diagram, $1/1-Z^{-1}$ and $Z^{-1}/1-Z^{-1}$ are the basic elements. Thus apply FIG. 1(b) and FIG. 1(c) into FIG. 2(a), a resulted single-ended-output delta-sigma ADC circuit is achieved and shown in FIG. 2(b).

Figure 2B:
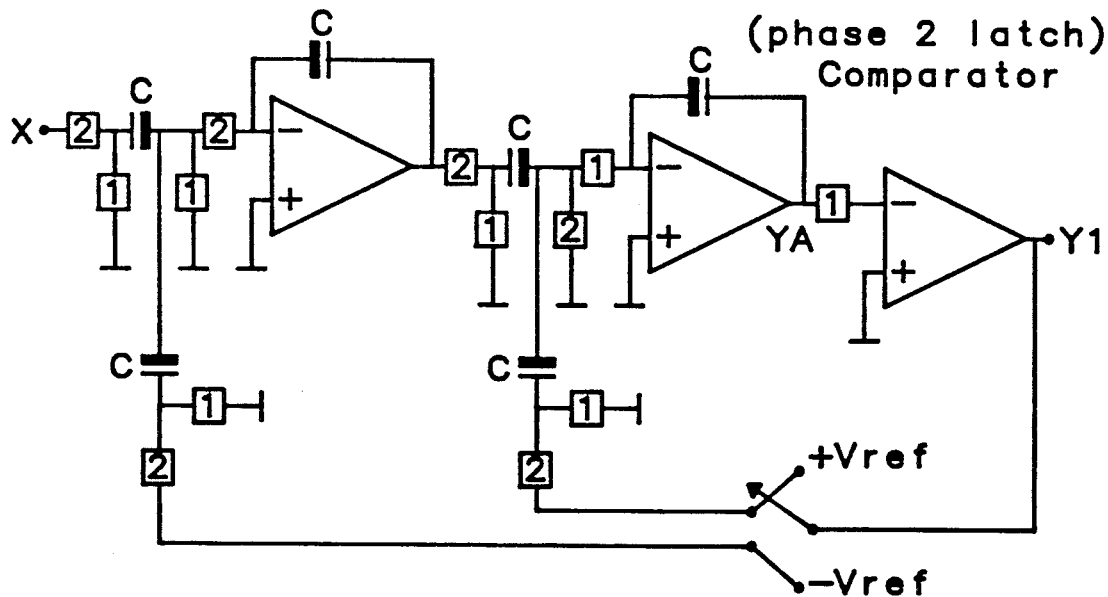
FIG. 2(b) Circuit diagram of FIG. 2(a), this structure is a single-ended-output circuit.

FIGS. 2(a) and 2(b) are a typical design example to realize a sigma-delta ADC [2] by the use of SC integrator as a basic element. In addition, many improved structures also can be obtained, which are all based on SC integrators to achieve a different performance result with some structure modification. For example, we can change the structure from one-bit output into multi-bit output (increasing quantiser resolution), or cascade them to form a higher-order sigma-delta ADC, or change them from the single-ended-output structure into the fully-differential-output structure. However, these sigma-delta ADCs are all based on SC integrators.

(2) Our proposed architectures

Figure 3:
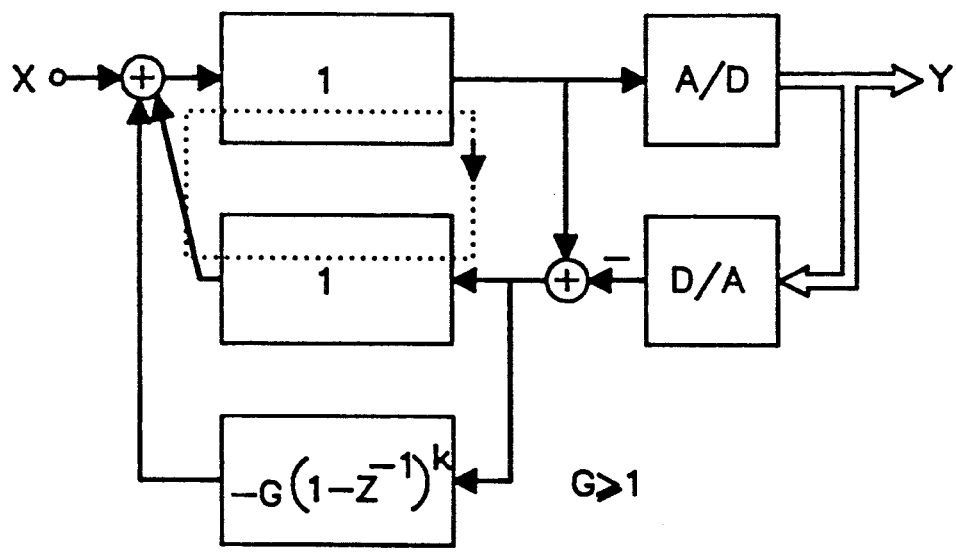
FIG. 3 Signal flow graph diagram of a sigma-delta ADC. This coder topology is based on SC differentiator $(1-Z^{-1})$ terms.

FIG. 3 is a signal flow graph (SFG) diagram of a k-order sigma-delta ADC, the basic elements of this new ADC architecture are SC differentiators which have a z-domain symbol $1-Z^{-1}$. And this SFG diagram is characterized by the transfer relation $$Y = X + Q\ G(1-Z^{-1})^k,\ G \geq 1 \tag{2}$$

The dashed line (delay-free) loop of this diagram makes the behavior simulation program difficult to write. But the circuit implementation and circuit simulation (SPICE program) can be completed as easy as the case of other conventional structures. The gain G must is larger than or equal to one. This gain G is larger and the system is more stable. If this gain G is less than 1 then the system will be unstable. Double of this gain G will cause the total noise power to increase by 3dB.

Figure 4:
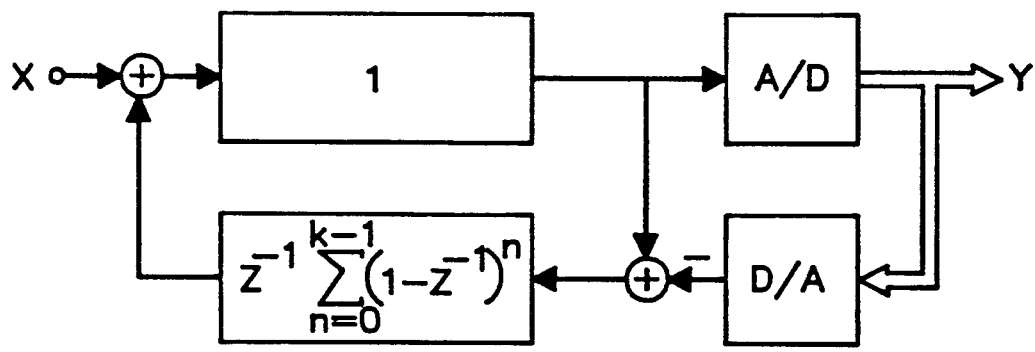
FIG. 4 Signal flow graph diagram of a sigma-delta ADC. This coder topology is based on SC differentiator $(1-Z^{-1})$ terms and SC delay $Z^{-1}$ terms.

When $G=1$, the mark region $1-(1-Z^{-1})^k$ of FIG. 3 can be rewritten as $$Z^{-1}\sum_{n=0}^{k-1}(1-Z^{-1})^n$$

and shown in FIG. 4. It is characterized by the transfer relation $$Y=X+Q(1-Z^{-1})^k. \qquad (3)$$

Because the delay element $Z^{-1}$ exists on all feedback loops, thus the behavior simulation program can be achieved easily and the requirement of comparator circuit of this structure will be relaxed. This coder topology is based on SC differentiator $1-Z^{-1}$ and SC delay $Z^{-1}$ terms. In this coder topology, $$\sum_{n=0}^{k-1}(1-Z^{-1})^n$$

can be realized by the use of SC differentiator only. Or changing $$\sum_{n=0}^{k-1}(1-Z^{-1})^n$$

to a form $$\sum_{n=0}^{k-1}a^n Z^{-n},$$

thus it can be realized by the use of SC delay only. Or this $$\sum_{n=0}^{k-1}(1-Z^{-1})^n$$

can also be realized by the use of SC differentiator and SC delay together. A large number of various coder topology versions can be obtained with some modification. However, the coder topology of FIG. 3 and FIG. 4 are all based on SC differentiators and SC delays, they are different from conventional coder topology which are based on SC integrators.

Figure 5:
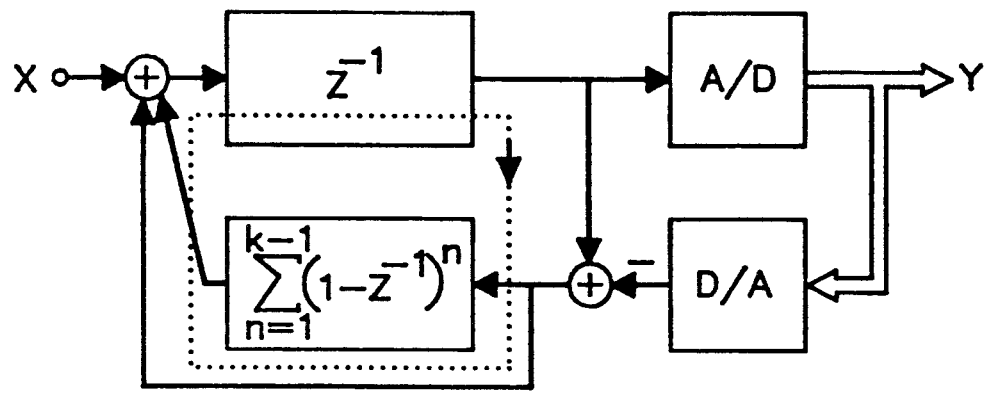
FIG. 5 Signal flow graph diagram of a sigma-delta ADC. This coder topology is based on SC differentiator $(1-Z^{-1})$ terms and SC delay $Z^{-1}$ terms, and a delay $Z^{-1}$ is at the forward-path.
Figure 6:
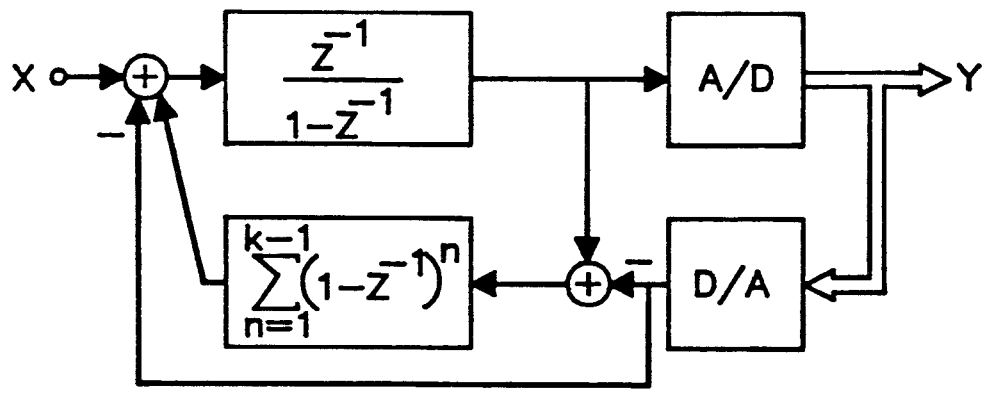
FIG. 6 Signal flow graph diagram of a sigma-delta ADC. This coder topology is based on an SC integrator $Z^{-1}/1-Z^{-1}$ term in the forward path and SC differentiator $(1-Z^{-1})$ terms (and SC delay $Z^{-1}$ terms) in the feedback loops.

Put the delay element $Z^{-1}$ of feedback loops of FIG. 4 into the forward path, the other new architecture can be obtained and is shown in FIG. 5. The dashed line loop of FIG. 5 can also be merged to form a forward-mapping integrator and the resulted SFG diagram is shown in FIG. 6. Like the FIGS. 3 and 4, the coder topology of FIG. 5 and 6 are also based on SC differentiators and SC delays to achieve a sigma-delta ADC function. Both of the transfer relation of FIG. 5 and FIG. 6 are characterized as $$Y=XZ^{-1}+Q(1-Z^{-1})^k. \qquad (4)$$

Because these SC delays and differentiators are compatible with SC integrators with clock operation scheme and fabrication process (The circuit implementation of SC delays and SC differentiators will be explained later), so these sigma-delta ADC (FIG. 3~FIG. 6) can also be incorporated with conventional sigma-delta ADC which are based on SC integrator to form new ones.

Figure 7:
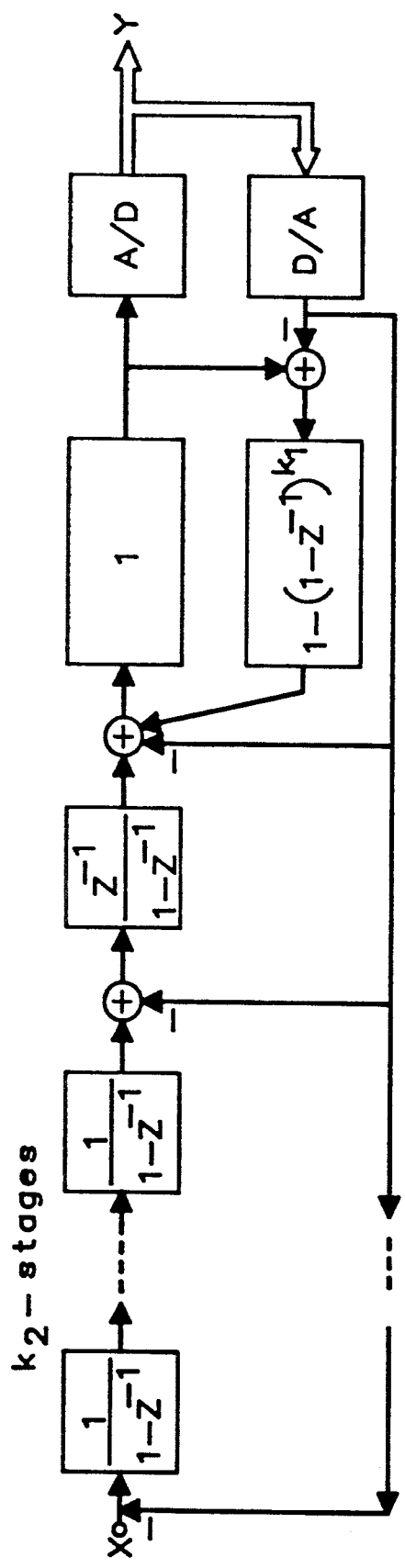
FIG. 7 A new sigma-delta architecture of combining conventional sigma-delta ADC and the coder topology of FIG. 3.

FIG. 7 is the resulted ADC of combining the conventional SC-integrator-based sigma-delta ADC and the sigma-delta ADC of FIG. 3, it is characterized by the transfer relation $$Y=XZ^{-1}+Q(1-Z^{-1})^{k1+k2}. \qquad (5)$$

Figure 8:
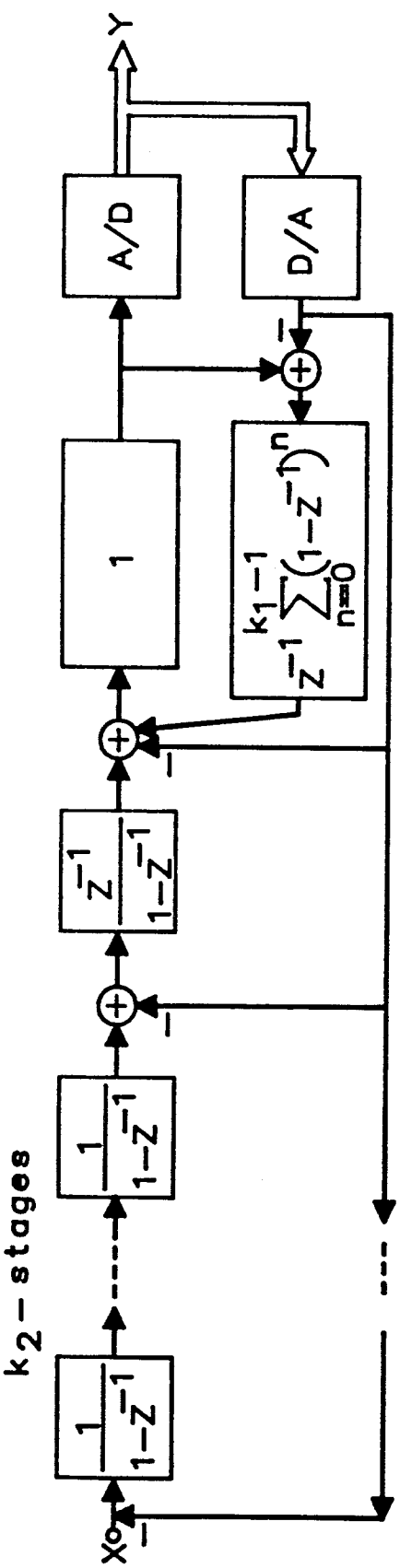
FIG. 8 A new sigma-delta architecture of combining conventional sigma-delta ADC and the coder topology of FIG. 4.
Figure 9:
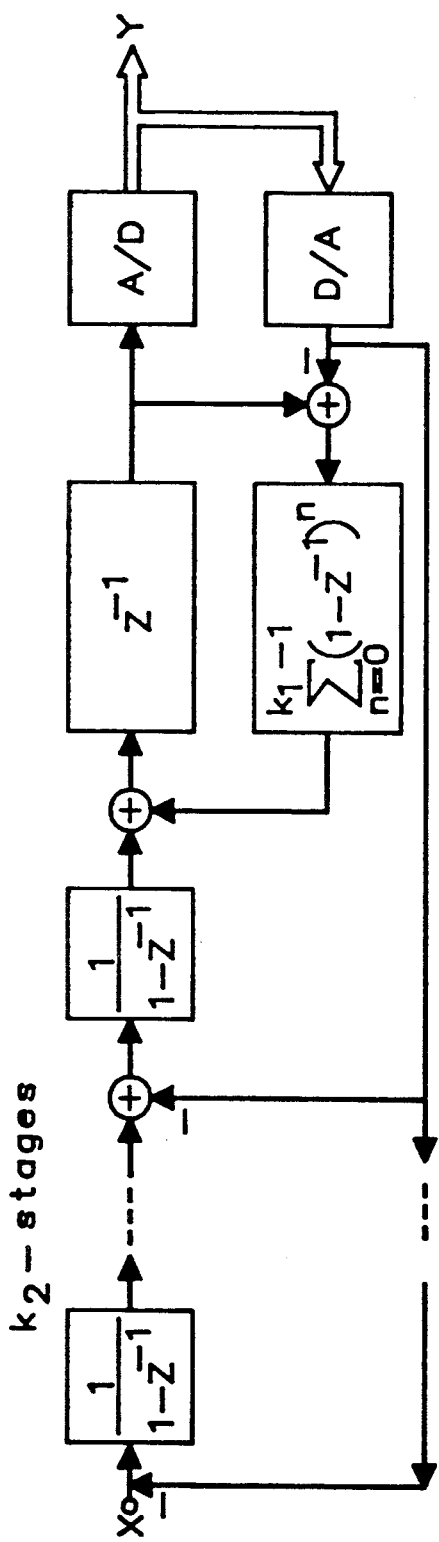
FIG. 9 A new sigma-delta architecture of combining conventional sigma-delta ADC and the coder topology of FIG. 5.
Figure 10:
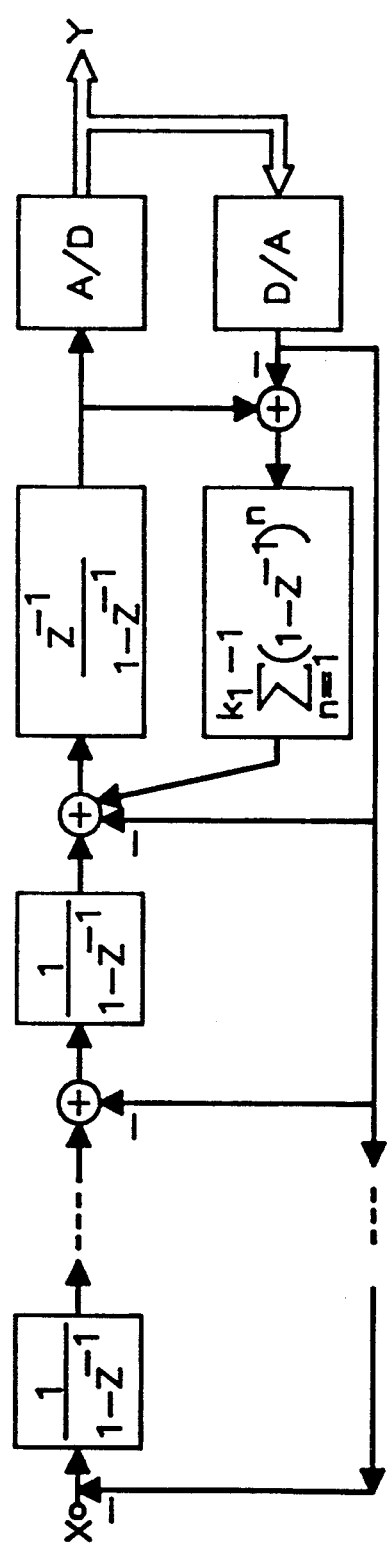
FIG. 10 A new sigma-delta architecture of combining conventional sigma-delta ADC and the coder topology of FIG. 6.

FIG. 8 is the resulted ADC of combining the conventional SC-integrator-based sigma-delta ADC and the sigma-delta ADC of FIG. 4, the transfer relation of this figure is characterized as equation (5). FIG. 9 is the resulted ADC of combining the conventional SC-integrator-based sigma-delta ADC and the sigma-delta ADC of FIG. 5, the transfer relation of this figure is characterized as equation (5). FIG. 10 is the resulted ADC of combining the conventional SC-integrator-based sigma-delta ADC and the sigma-delta ADC of FIG. 6, the transfer relation of this figure is characterized as equation (5).

In order to decrease the total in-band noise power, there are some methods can be adopted: (1) increasing the coder order; (2) increasing oversampling ratio; (3) increasing quantiser resolution; (4) or changing the pole-zero location [2], etc. Each of these approaches, however, has its own difficulties. In this invention, we proposed some new architectures of sigma-delta ADC in order to provide more design flexibility and freedom. All block diagrams of FIG. 3~FIG. 10 may be one-bit output or multi-bit output (increasing quantiser resolution), these diagrams can be also cascaded to form high order sigma-delta ADC. What is more, like some modification technique in the conventional SC-integrator-based sigma-delta ADCs, these new developed diagrams based on SC differentiators and SC delays can also be improved to form other new coder topology with similar technique to achieve different performance requirement.

(3) Switched-Capacitor (SC) Circuit Diagram

In our proposed architectures, there are three functions; (1) inversion: (2) delay; (3) differentiation that must be applied to organize them. These function circuits are realized by the use of SC circuits and the resulted circuits are shown in FIG. 11~FIG. 14. The fabrication processes and operating clocks are fully compatible with the conventional SC integrators. Thus the architecture of FIG. 3~FIG. 10 are realizable by the use of SC circuit technique.

Figure 11A:
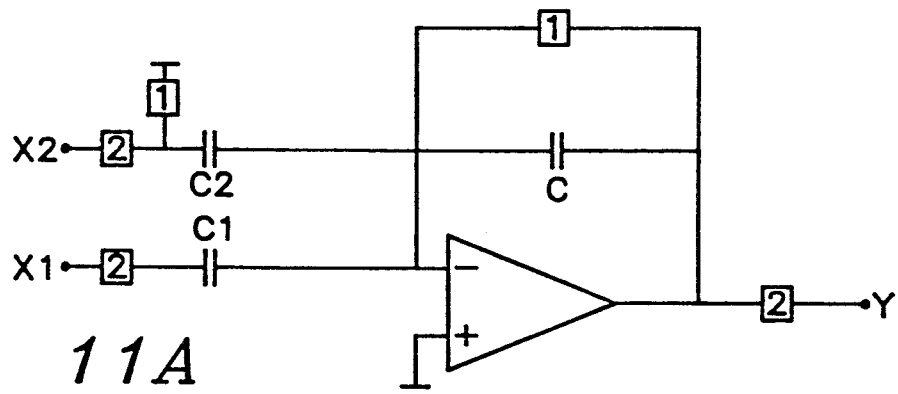
FIG. 11(a) A "return to zero" type of single-ended-output SC differentiator circuit diagram with input X1 and SC inverter circuit with input X2. Because the input terminal (virtual ground terminal) and output terminal of operational amplifier is shorted to force output terminals to ground voltage during phase 1, so this type is named "return to zero" type.
Figure 11B:
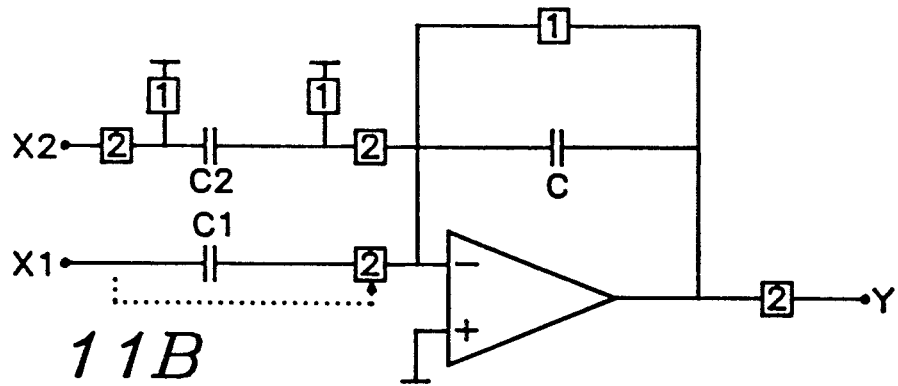
FIG. 11(b) A "return to zero" type of single-ended-output SC differentiator circuit diagram with input X1 and SC inverter circuit with input X2. The phase 2 switch of input X1 is at the virtual ground terminal of operational amplifier.

Monolithic switched-capacitor differentiator circuit has been proposed by [4] and is again shown in FIG. 11(a) for convenience. This backward-mapping SC differentiator with the transfer function relation $Y=X(1-Z^{-1})$ retains some inherent circuit advantages, such as, it has a good low-frequency noise-rejection capability just as the function $Y=X+Q(1-Z^{-1})$ of sigma-delta ADC. In addition, the "return to zero" effect during phase 1 makes this SC differentiator circuits much less sensitive to clock feed-through noise, dc offset voltage, and power supply voltage variation, etc. Beside these it also has other circuit advantages as proposed in [4]. Since the SC differentiator must "return to zero" during phase 1, it puts the slew rate limitation of op-amp on where the maximum output voltage with maximum load capacitor is relaxed. This is because the voltage swing of output nodes in the sigma-delta ADC are all random process when the voltage of the output nodes change from present state to next state. Thus the transient response time of operational amplifier (OPAMP) is reduced and optimized and the requirement of fast settling time or slew rate is released by the use of "return to zero" type circuit in the sigma-delta ADC. The switch (phase 2) of inputput path X1 in FIG. 11(a) can be shifted into the virtual ground terminal of the operational amplifier and is shown in FIG. 11(b), thus charge injection noise at switch turn off can be reduced. To invert a signal, X2 can be added into the circuit to perform the required signal inversion in FIG. 11(a) and 11(b). The mark region of 11(b) can be removed from the FIG. 11(b) without causing the function failure. Both transfer functions of FIG. 11(a)~ FIG. 11(b) are identical and given below $$Y = X1\left(-\frac{C1}{C}\right)(1 - Z^{-1}) + X2\left(-\frac{C2}{C}\right). \quad (6)$$

Figure 11C:
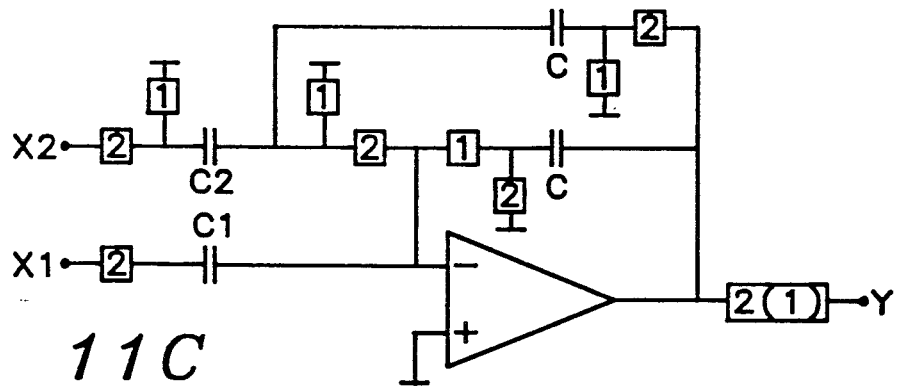
FIG. 11(c) A single-ended-output SC differentiator circuit diagram with input X1 and SC inverter circuit with input X2. The output voltage is also hold during phase 1.
Figure 11D:
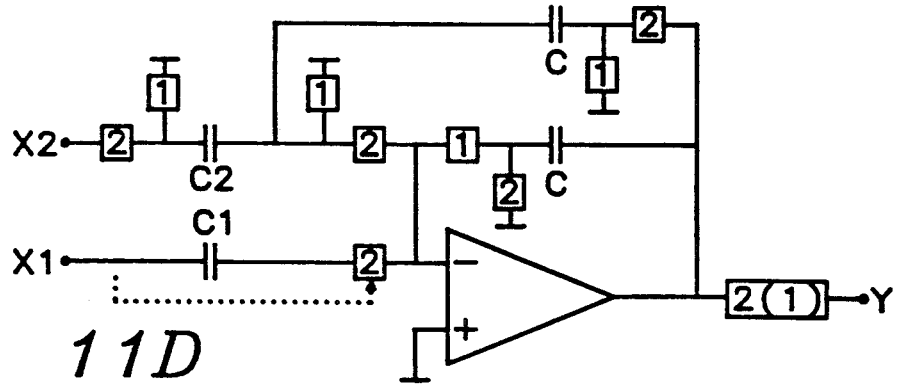
FIG. 11(d) A single-ended-output SC differentiator circuit diagram with input X1 and SC inverter circuit with input X2. The output voltage is hold during phase 1 and the phase 2 switch of input X1 is exist at the virtual ground terminal of operational amplifier.
Figure 12A:
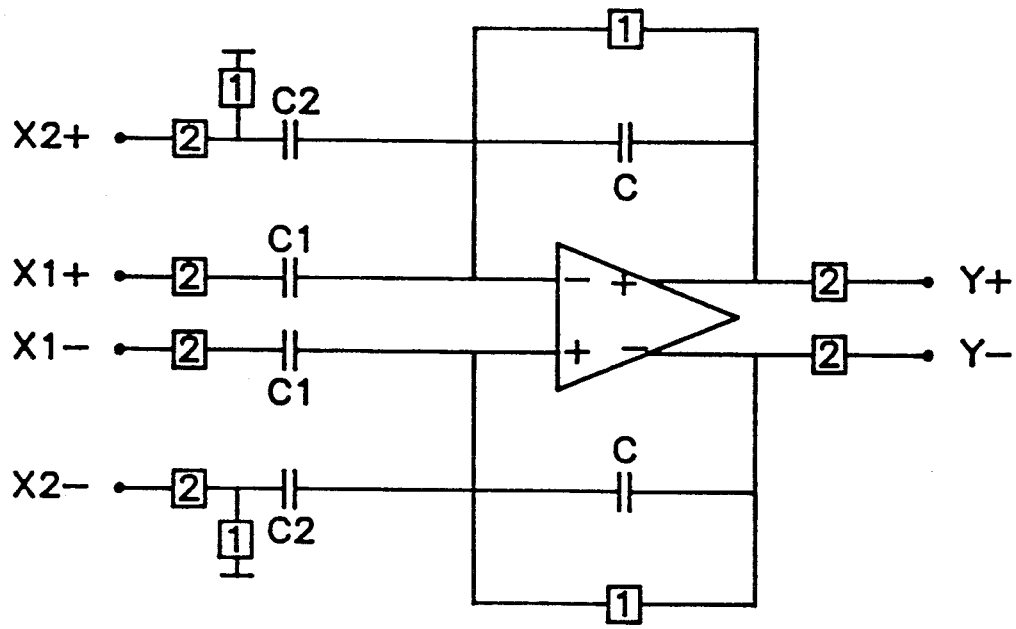
FIG. 12(a) A fully-differential-output version of FIG. 11(a)
Figure 12B:
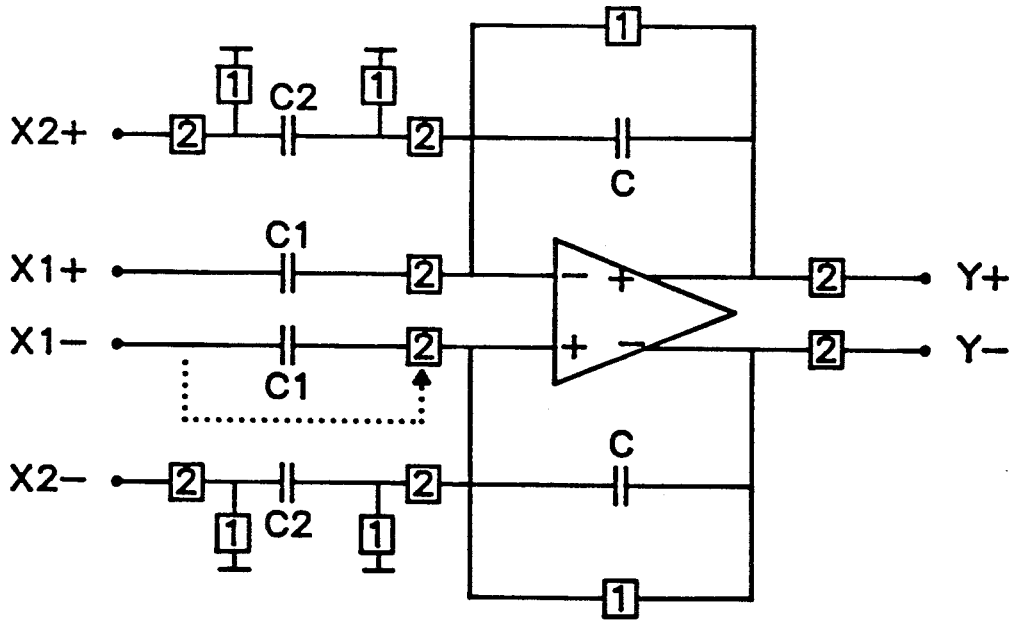
FIG. 12(b) A fully-differential-output version of FIG. 11(b)
Figure 12C:
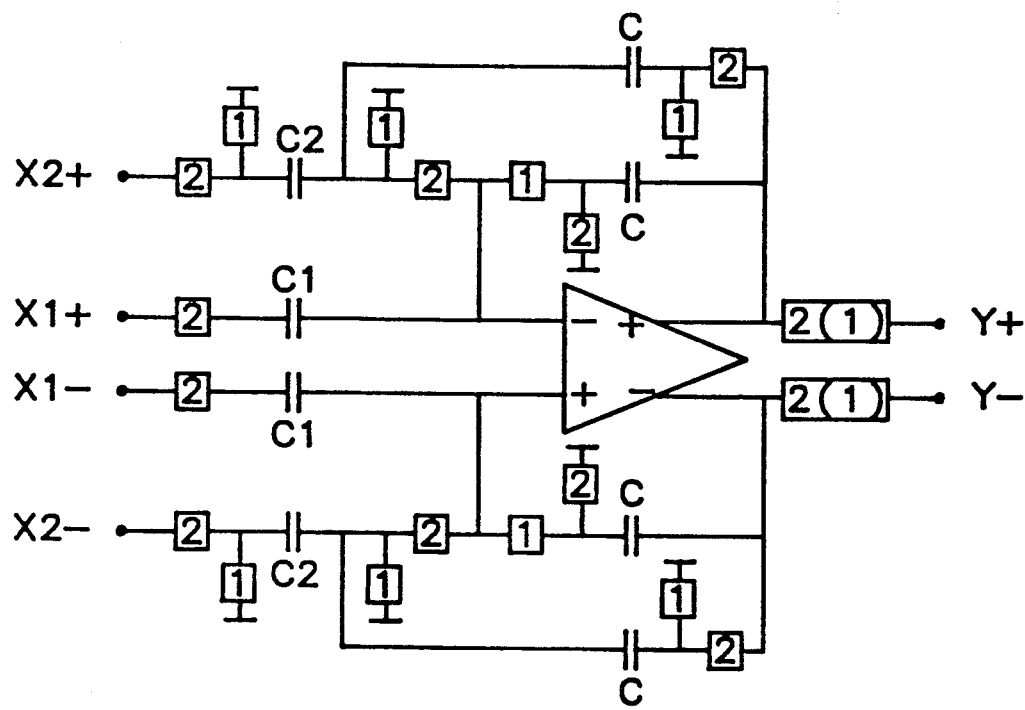
FIG. 12(c) A fully-differential-output version of FIG. 11(c)
Figure 12D:
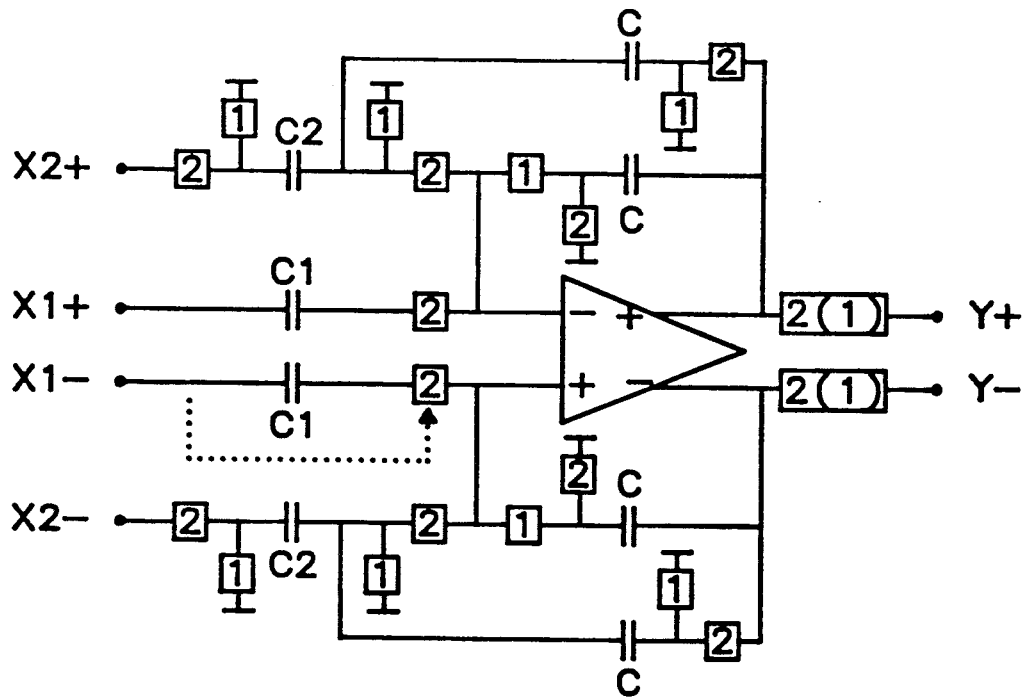
FIG. 12(d) A fully-differential-output version of FIG. 11(d)

New SC differentiator circuit structures are also proposed in FIG. 11(c) and 11(d). These circuits use the additional capacitor to hold the output voltage during the phase 1. Both FIG. 11(c) and FIG. 11(d) retain some circuit advantages just as FIG. 11(a) and 11(b), these are less sensitive to clock feedthrough noise, offset voltage of OPAMP, power supply voltage variation, etc.. They also have the same transfer relation as equation (6).

The figures of FIG. 11 are single-ended-output type of our proposed switched-capacitor differentiator, their fully-differential-output versions are shown in FIG. 12. Except their terminals of input/output are different, other characteristics of the circuit are same. In general, fully-differential-output versions have a lower noise immunity, larger voltage dynamic range and bandwidth characteristics but also have a more expensive chip area, more power consumption and complex layout.

Figure 13A:
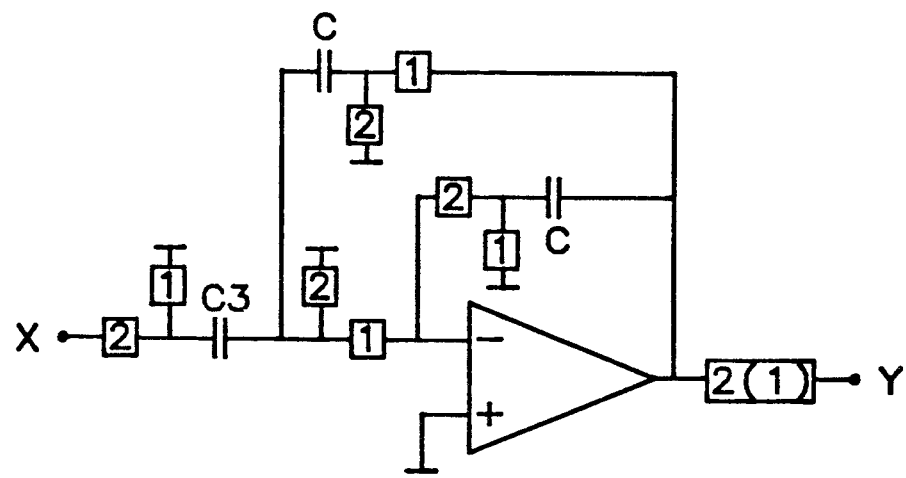
FIG. 13(a) A single-ended-output SC delay circuit diagram.
Figure 13B:
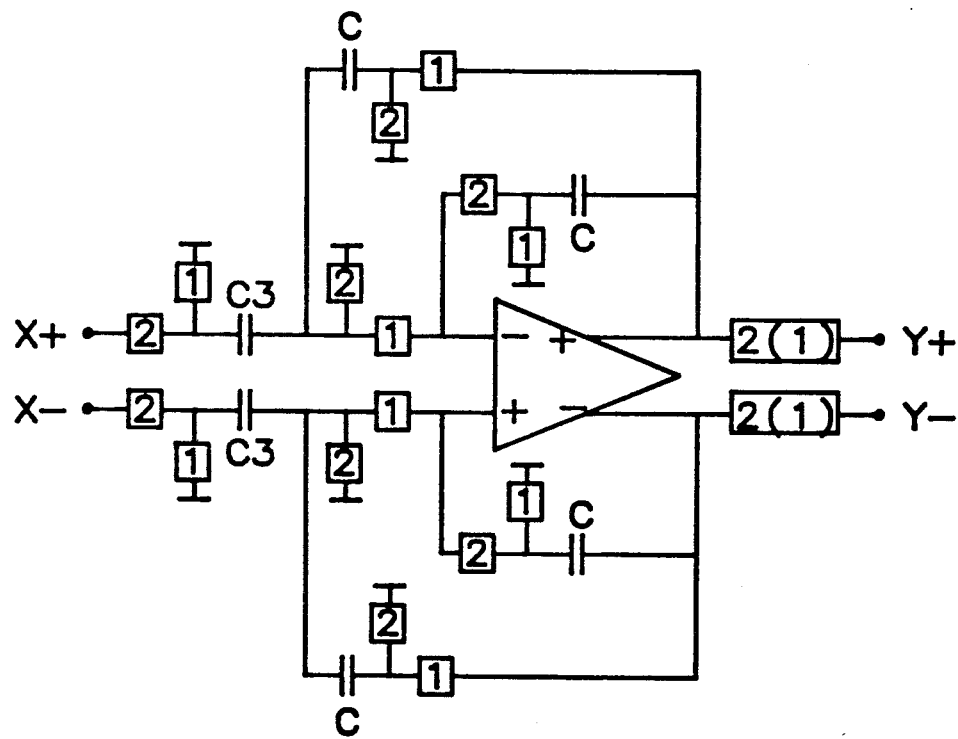
FIG. 13(b) A fully-differential-output version of FIG. 13(a)

To delay a discrete signal, the novel SC delay shown in FIG. 13 can be used. The FIG. 13(a) and FIG. 13(b) are the single-ended-output and fully-differential-output version, respectively. Their transfer relation in the z-domain model can be characterized as $$Y = X3\left(-\frac{C3}{C}\right)Z^{-1}. \quad (7)$$

Figure 14A:
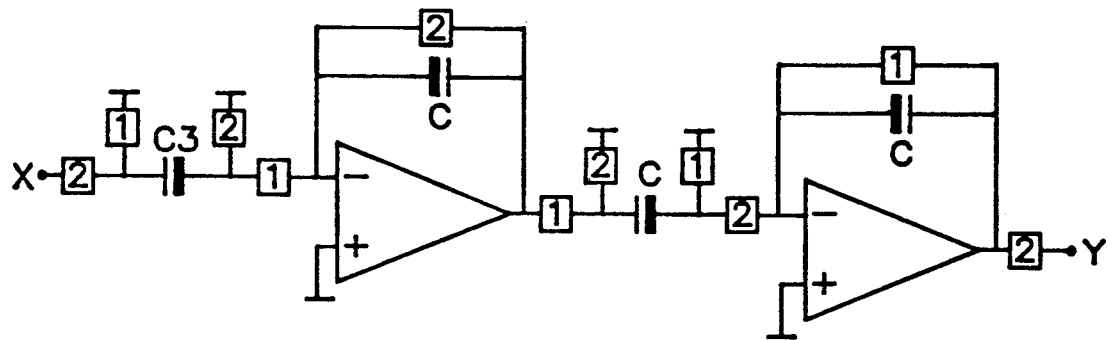
FIG. 14(a) A "return to zero" type of single-ended-output SC delay circuit diagram.
Figure 14B:
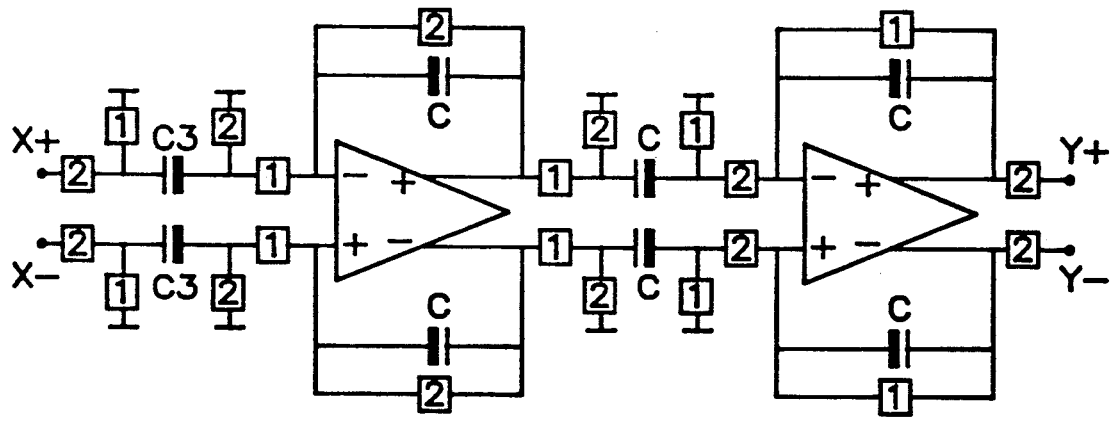
FIG. 14(b) A fully-differential-output version of FIG. 14(a)

The "return to zero" type of SC delay are shown in FIG. 14. They retain the same circuit advantages just as the "return to zero" type of SC differentiator. Their transfer relation in the z-domain are characterized as Eq. (7). The FIG. 14(a) and FIG. 14(b) are the single-ended-output and fully-differential-output version, respectively.

Both FIG. 14(a) and 14(b) need two operational amplifiers, compared to SC delays of FIG. 13, the chip area of FIG. 14 is large, but this also makes the capacitor value spread and voltage scaling of sigma-delta ADC be obtained with a better trade-off conditions, this is worth in the realization of integrated circuit with more OPAMPs be used.

All the developed SC circuits of FIG. 11 ~ FIG. 14 have same clock operation scheme just as conventional SC integrators and is shown in FIG. 1(d).

(4) Design Examples

Figure 15:
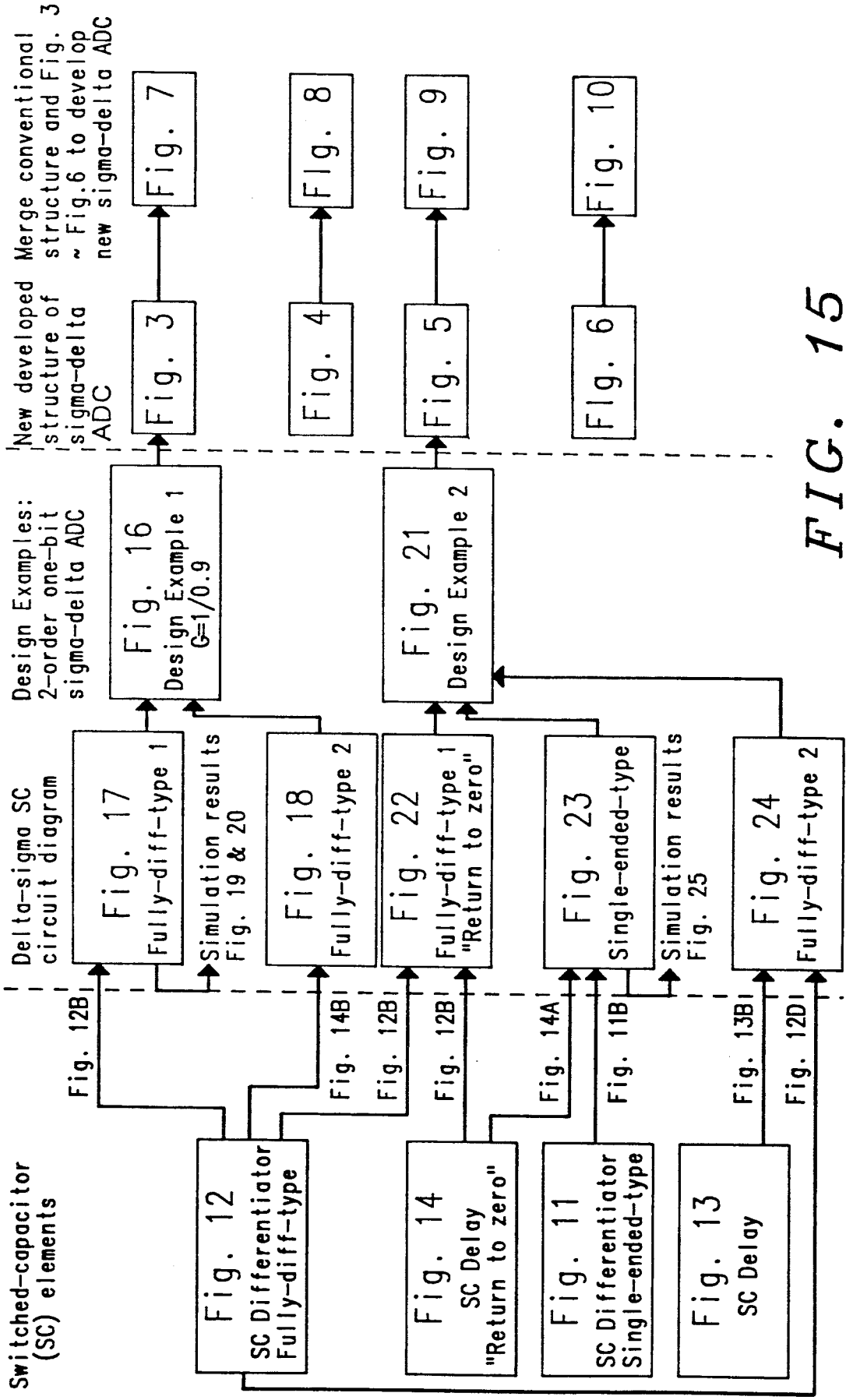
FIG. 15 A figure to explain the relation of the proposed architectures (in the right) and proposed SC circuits (in the left) through some examples (in the middle) demonstrate. This figure will clearly illustrate the feature of our invention.

The figures (FIG. 3 ~ FIG. 10) in the right of FIG. 15 are our proposed new sigma-delta ADC architectures, the figures (FIG. 11 ~ FIG. 14) in the left of FIG. 15 are the SC function circuits. In order to apply the SC function circuits (in the left) into the proposed architectures (in the right) to develop practical integrated circuit, we use the some design examples which are shown in the middle of FIG. 15 to demonstrate the flexibility of design process and the usefulness of the resulted circuits.

Figure 16:
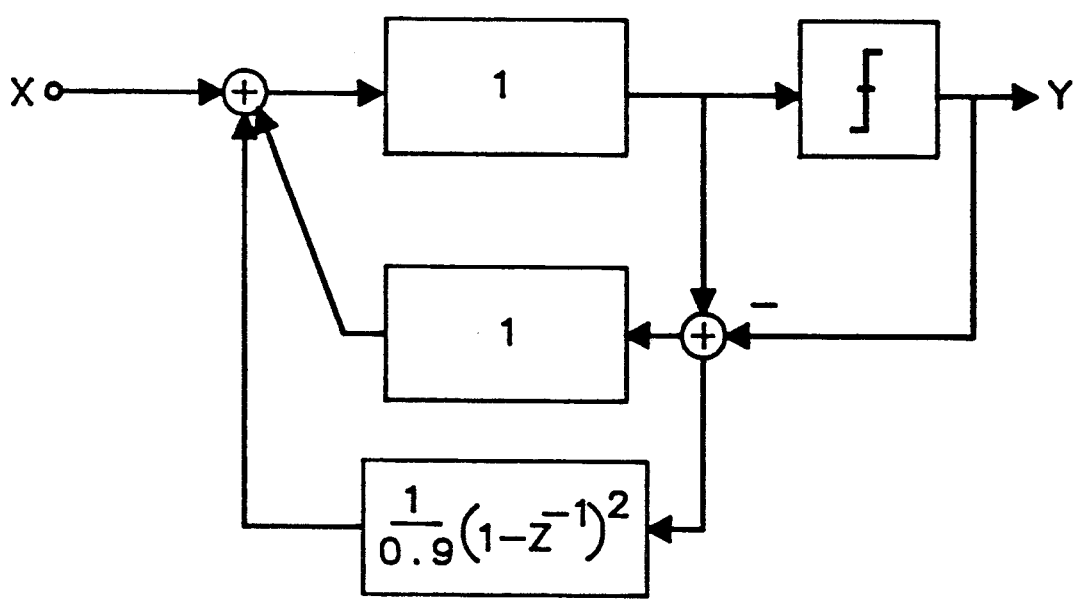
FIG. 16 Signal flow graph diagram of a second-order one-bit sigma-delta ADC. The basic elements of this structure are SC differentiators.

FIG. 16 is the SFG diagram of a one-bit second-order sigma-delta ADC which is conducted from FIG. 3 with $G = 1/0.9$. In this figure, the differentiator block $1 - Z^{-1}$ can be realized by the circuit of FIG. 11 ~ FIG. 12. Now, we apply the SC differentiator of FIG. 12(b) to this SFG diagram, thus the resulted circuit diagram is structured as FIG. 17. Like conventional sigma-delta ADC, the one-bit A/D converter can be realized by a comparator, and one-bit D/A converter can be realized by Vref and −Vref through the control of output state of comparator. The mark region of the FIG. 17 can be removed without function failure.

Figure 17:
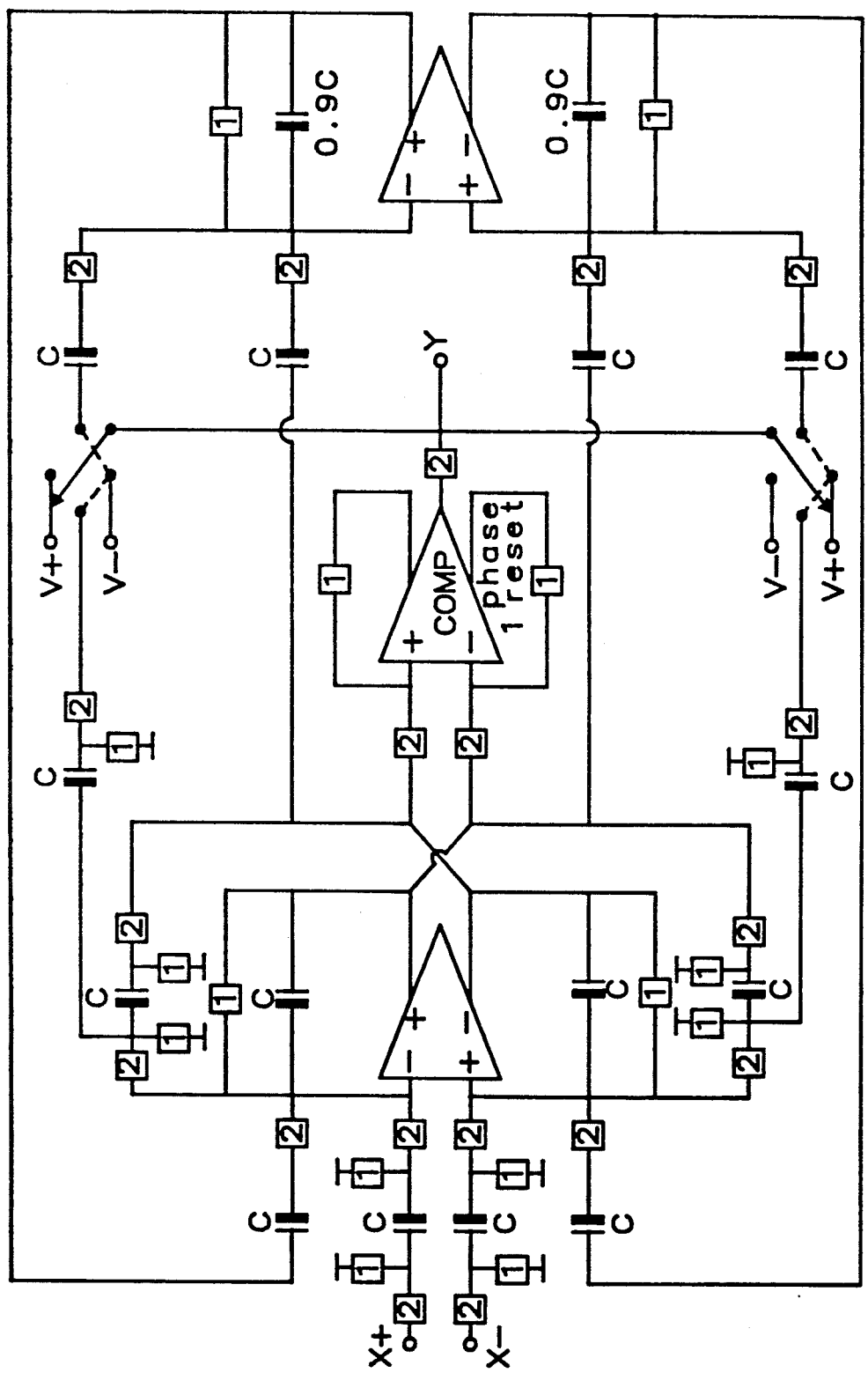
FIG. 17 Circuit diagram of FIG. 16, this structure is a fully-differential-output circuit, the SC differentiators are realized by the use of FIG. 12(b)
Figure 18:
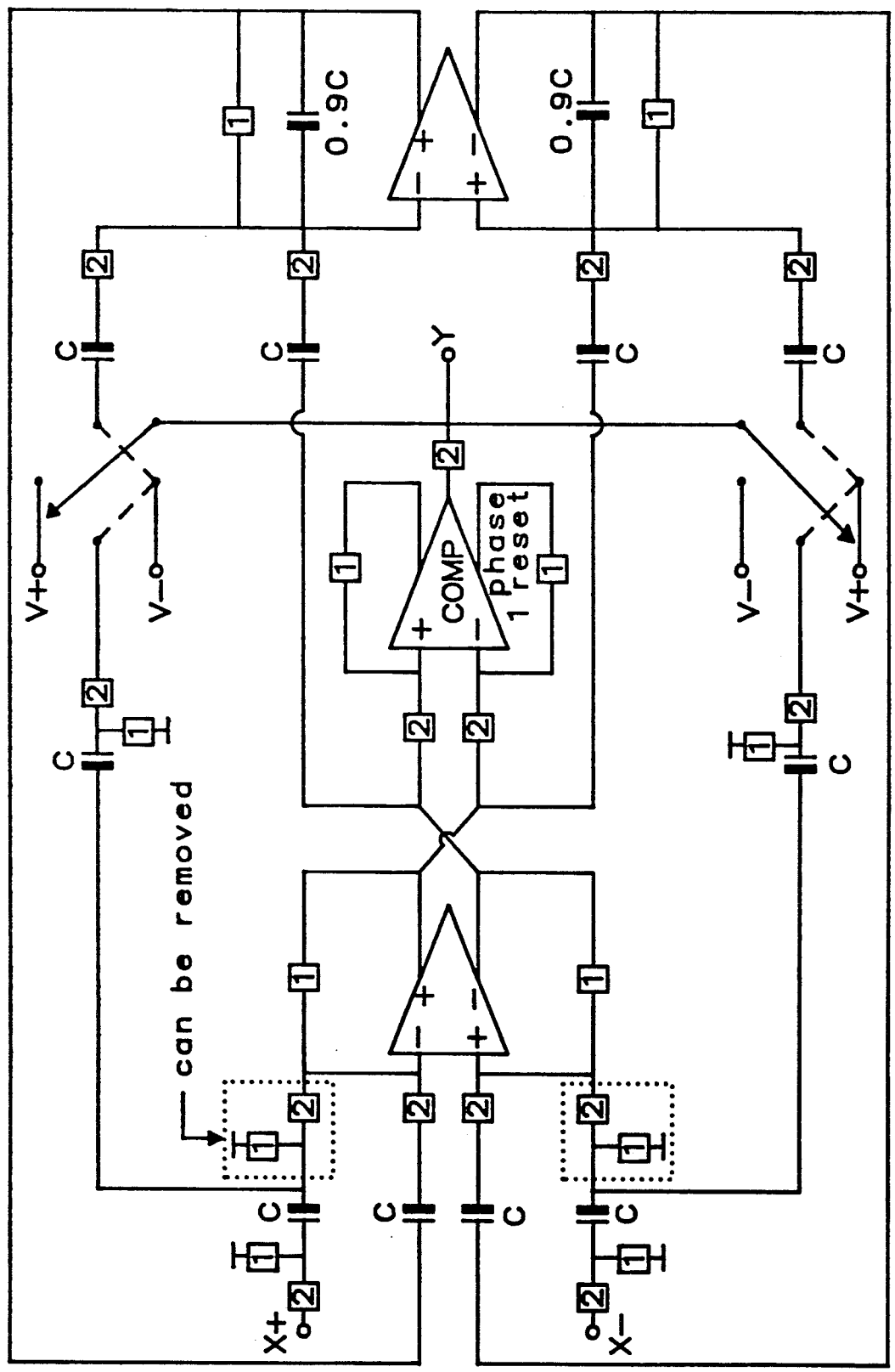
FIG. 18 Circuit diagram of FIG. 16, this structure is a fully-differential-output circuit, the SC differentiators are realized by the use of FIG. 12(b), this circuit diagram has less switches and capacitors than FIG. 17.
Figure 19:
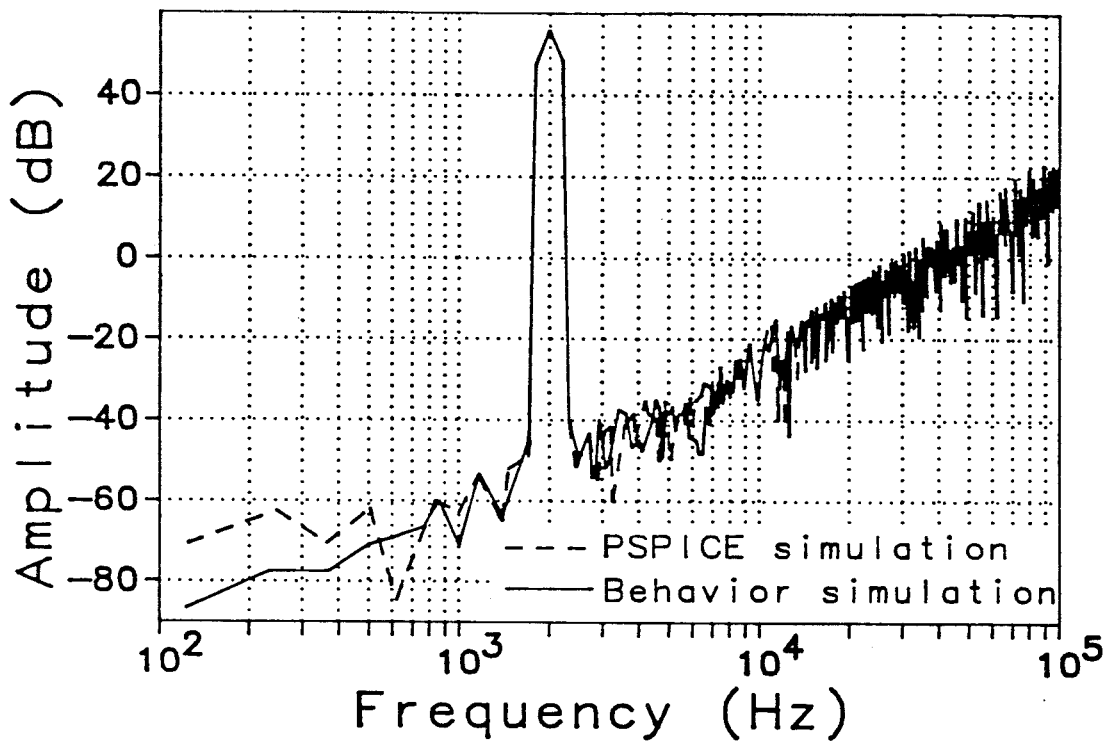
FIG. 19 The output spectrum with PSPICE and behavior simulation results of FIG. 17.
Figure 20:
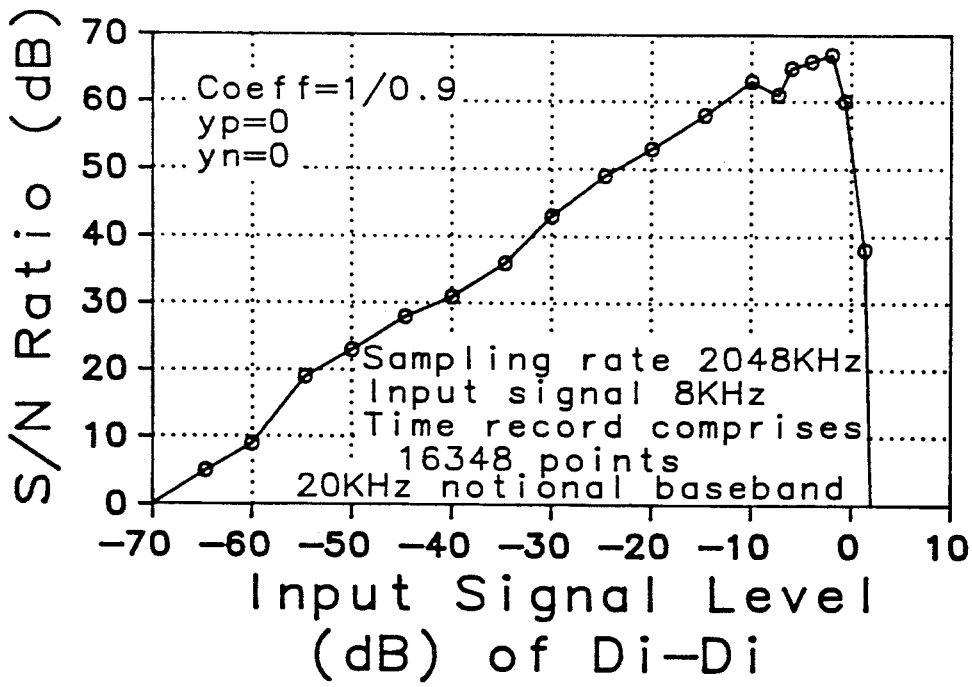
FIG. 20 Simulated response of FIG. 17 with signal-to-noise (SNR) ratio as a function of input signal level.

In the FIG. 17, the capacitor in node 1 and node 8 (node 2 and node 7) and the capacitor and switches in node 2 and node 120 (node 1 and node 110) can be canceled to form a new circuit structure and is shown in FIG. 18. Thus some capacitors and switches can be saved to obtained a less chip area of the circuit implementation. Through function simulation of FIG. 17 and 18 we can verify the correct operation of these proposed structures. The output spectrum simulation of FIG. 17 is shown in FIG. 19. For this simulation, the test tone is a sine wave with 2 KHz and 1 V amplitude, the loop rate is 2.048 MHz, and time record comprises 16384 points. Both behavior simulation and PSPICE simulation results are plotted. The dynamic range of the circuit was also simulated as a function of input signal level. The results are shown in FIG. 20 with a 2.048 MHz sampling rate, a 8 KHz test sine wave, and 20 KHz notional baseband. Good performance of simulation responses verifies the correct operation of this proposed structure.

Figure 21:
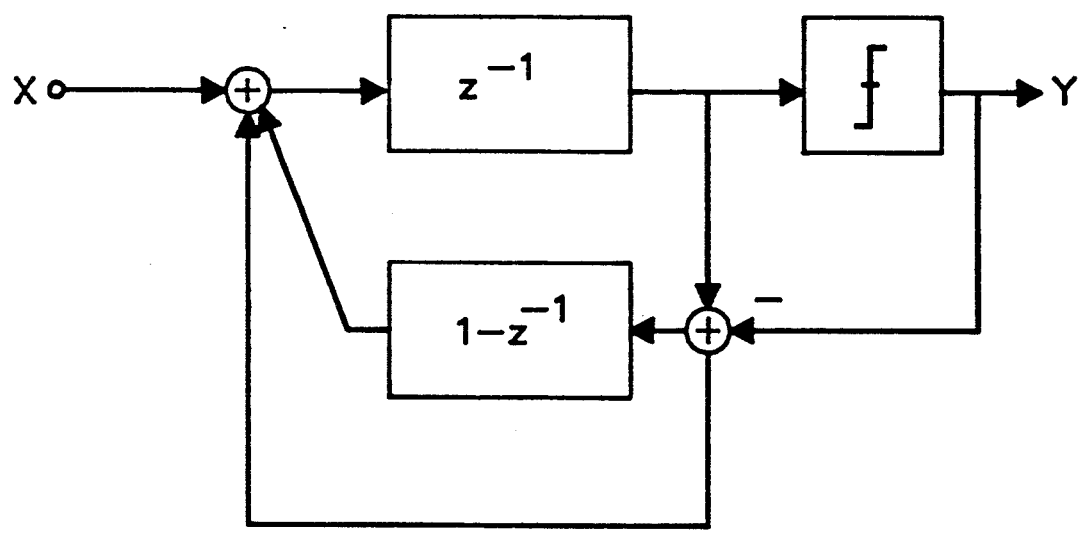
FIG. 21 Signal flow graph diagram of a second-order one-bit sigma-delta ADC. The basic elements of this structure are SC differentiators and SC delays.

As another example to demonstrate the developed architecture, the SFG diagram of a one-bit second-order sigma-delta ADC which is constructed from FIG. 21 is also presented here. In this figure, the differentiator block $1 - Z^{-1}$ can be implemented by the circuits of FIG. 11 ~ FIG. 12, whereas the delay element block $Z^{-1}$ can be realized by the use of circuits of FIG. 13 ~ FIG. 14. Now we shall give three different SC circuit structures to explain the flexibility and freedom in the design of a given SFG diagram of the proposed delta-sigma ADC. First applying the SC differentiator of FIG. 12(b) and the SC delay of FIG. 14(b) into FIG. 21, the resulted circuit diagram named fully-differential-output with "return to zero" type can be structured as FIG. 22. And applying the SC differentiator of FIG. 11(b) and SC delay of FIG. 14(a) into FIG. 21, the resulted circuit diagram named single-ended-output with "return to zero" type can be structured as FIG. 23. Finally applying the SC differentiator of FIG. 12(d) and SC delay of FIG. 13(b) into FIG. 21, the resulted circuit diagram named fully-differential-output without "return to zero" type can be structured as FIG. 24. The simulation results of all the these circuits are good as theoretical calculation results. FIG. 25 is the simulation results of FIG. 23 with the dynamic range as a function of input signal level. The test signal is a 8 KHz sine wave with a 2.048 MHz sampling rate and 20 KHz notional baseband.

Figure 22:
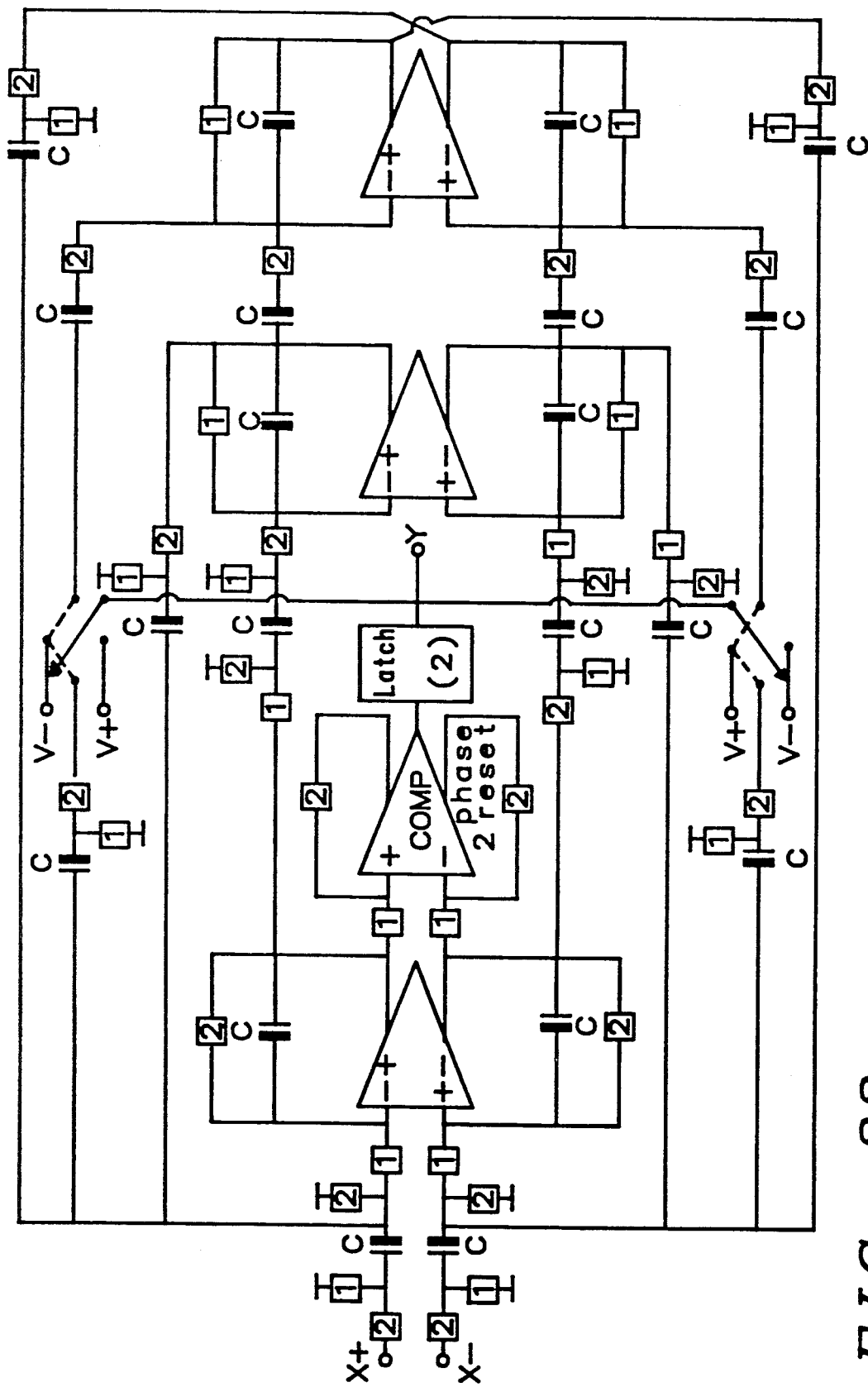
FIG. 22 Circuit diagram of FIG. 21, this structure is a fully-differential-output circuit, the SC differentiator block and SC delay block diagrams are implemented by the use of FIG. 12(b) and FIG. 14(b), respectively.
Figure 23:
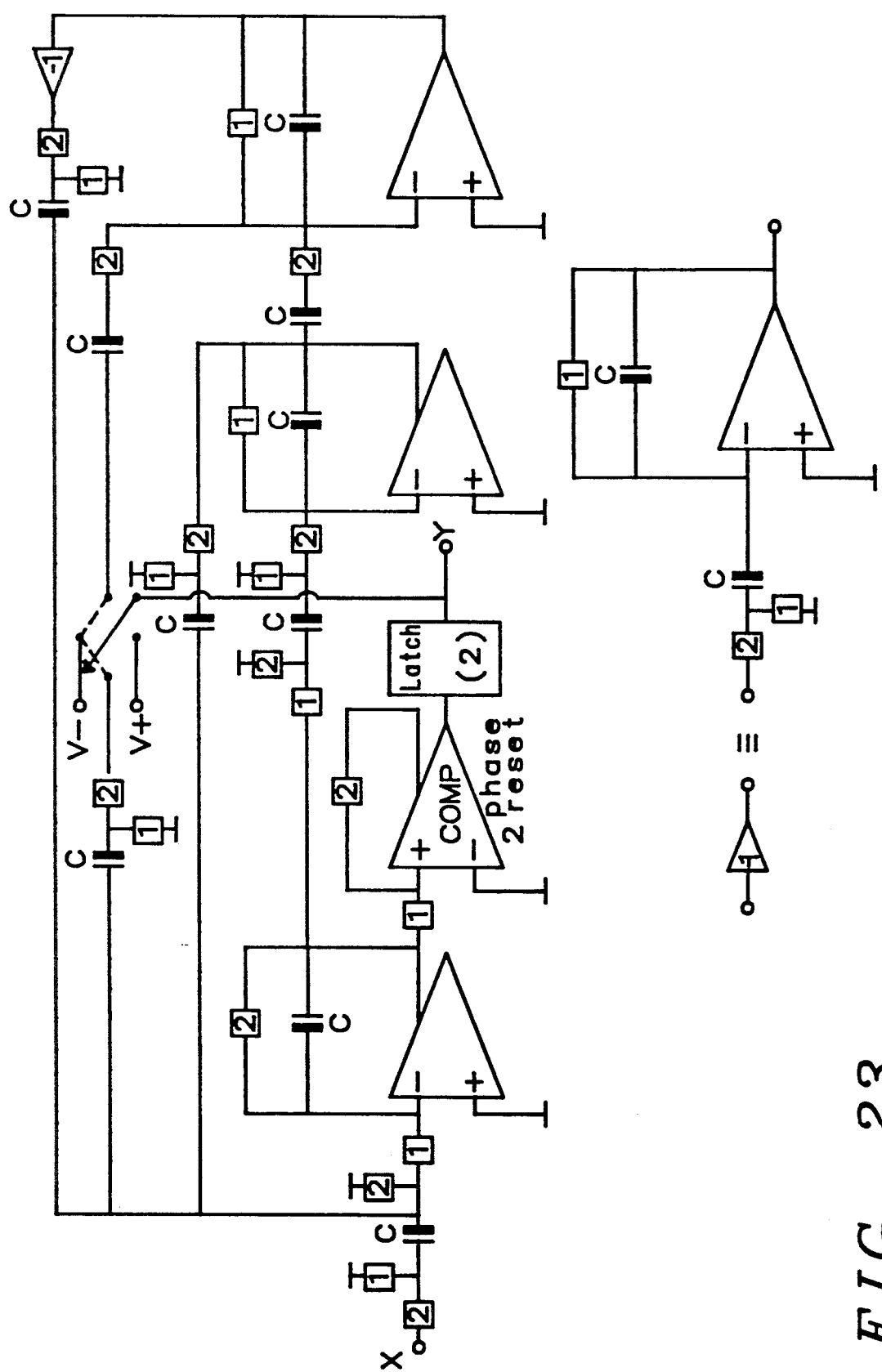
FIG. 23 Circuit diagram of FIG. 21, this structure is a single-ended-output circuit, the SC differentiator block and SC delay block diagrams are implemented by the use of FIG. 11(b) and FIG. 14(a), respectively.
Figure 24:
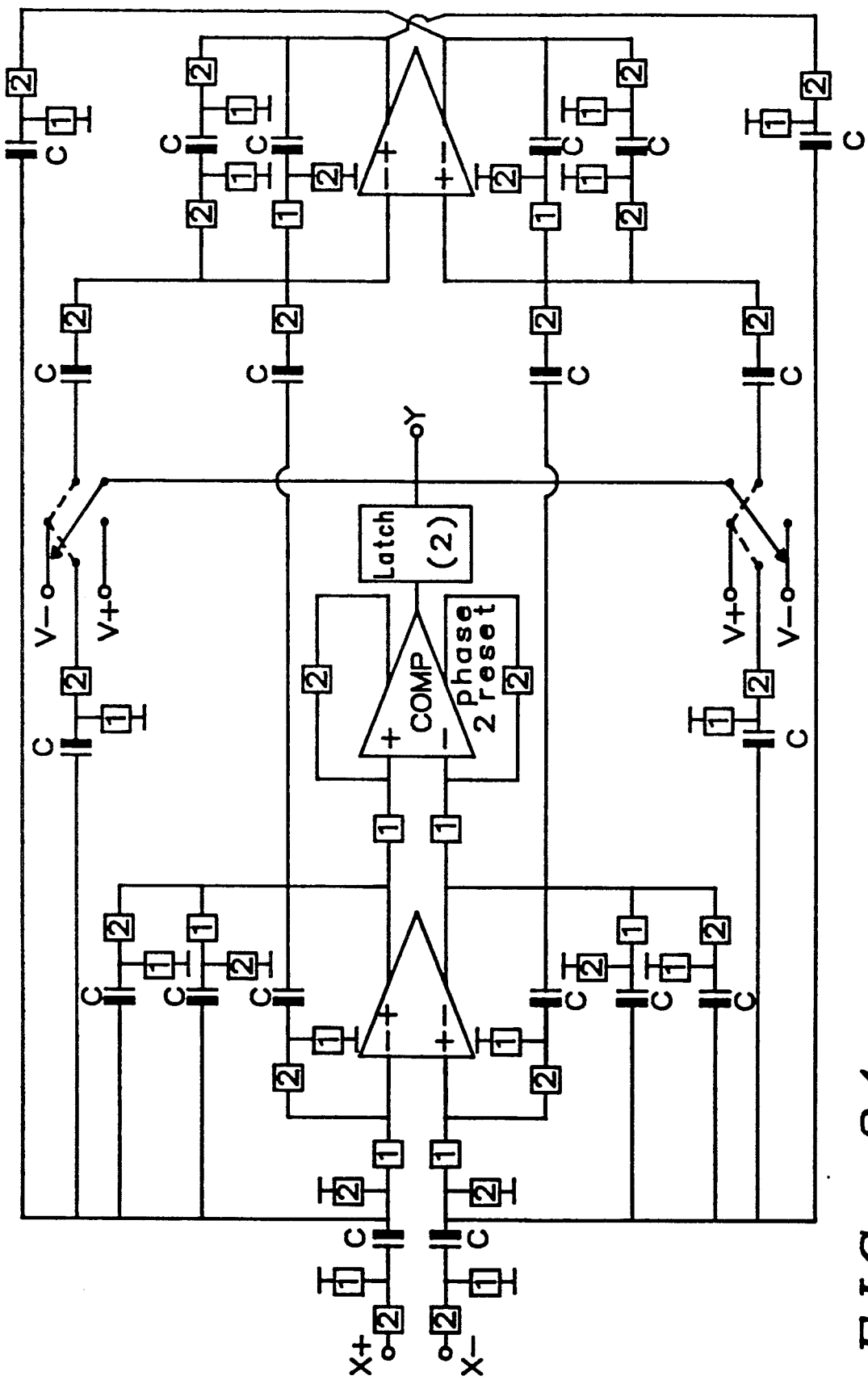
FIG. 24 Circuit diagram of FIG. 21, this structure is a fully-differential-output circuit, the SC differentiator block and SC delay block diagrams are implemented by the use of FIG. 12(d) and FIG. 13(b), respectively.

From the design examples of FIG. 16~FIG. 24 and FIG. 2, we know that a transfer function as $Y = X + Q(1-Z^{-1})^2$ can be realized with different signal flow graph diagram based on different basic functions, $Z^{-1}$, $1-Z^{-1}$, $Z^{-1}/1-Z^{-1}$, $1/1-Z^{-1}$. And a given signal SFG diagram FIG. 16 (FIG. 17) also can be realized by using different SC elements with same function but different SC circuits, thus the resulted circuit will be different just as FIG. 17 and FIG. 18 (FIG. 22, FIG. 23, and FIG. 24). The capacitor of these circuit structures also can be scaled to optimize the capacitor value spread and output voltage swing. Anyway, based on SC delays and SC differentiators, there are many structures can be obtained with some simple structure modification.

While the invention has been particularly shown and described with reference to the preferred embodiments thereof, it will be understood by those skilled in the art that various changes in form and details may be made without departing from the spirit and scope of the invention.

What is claimed is:

1. A sigma-delta analog to digital converter (FIG. 5) having means forming a forward path including a switched capacitor delay element having a transfer function $z^{-1}$ and means forming a feedback path including a single ended output type switched capacitor differentiator having a transfer function $1-z^{-1}$.

2. The sigma-delta analog to digital converter of claim 1 wherein the switched capacitor differentiator comprises
an operational amplifier (FIG. 11), means for providing first and second non-overlapping clocks, an input circuit comprising a capacitor and a first switch synchronized with said second clock wherein said first switch is between said capacitor and said operational amplifier terminal, and a feedback circuit including a capacitor in parallel with a second switch synchronized with said first clock.

3. The differentiator of claim 2 and further comprising an output circuit having a third switch synchronized with said second clock.

4. The differentiator of claim 3 and further comprising signal inversion means for inverting a signal including a second input circuit to said operational amplifier circuit comprising a capacitor and a fourth switch synchronized with said second clock.

5. The analog to digital converter of claim 4 wherein the transfer function is defined by the equation:

$$Y = X1(-C1/C)(1-z^{-1}) + X2(-C2/C)$$

wherein Y is the output; X1 and X2 are inputs; $1-z^{-1}$ is characteristic of input/output relation of the differentiator in the z-domain; C is capacitance of feedback capacitor; C1 is the capacitance of an input capacitor in X1 input circuit and C2 is the capacitance of an input capacitor in X2 input.

6. The differentiator of claim 2 and further comprising a capacitor in series with said second switch in said feedback circuit.

7. A sigma-delta analog to digital converter (FIG. 5) having means forming a forward path including a switched capacitor delay element ($z^{-1}$) and means forming a feedback path including a fully differential output type switched capacitor differentiator.

8. The switched capacitor differentiator of claim 7 comprising an operational amplifier having + and − input and output terminals; means for providing first and second non-overlapping clocks; a first input circuit to said − terminal of said operational amplifier comprising a capacitor and a first switch synchronized with said second clock wherein said first switch is between said capacitor and said operational amplifier terminal, a second input circuit to said + terminal of said operational amplifier comprising a capacitor and a first switch synchronized with said second clock wherein said first switch is between said capacitor and said operational amplifier terminal; and a feedback circuit including a capacitor in parallel with a second switch synchronized with said first clock.

9. The differentiator of claim 8 and further comprising an output circuit having a third switch synchronized with said second clock in both the + and − output terminals of the said operational amplifier.

10. The differentiator of claim 9 and further comprising signal inversion means for inverting a signal including a second input circuit to both the + and − terminals of said operational amplifier circuit comprising a capacitor and a fourth switch synchronized with said second clock.

11. The differentiator of claim 10 wherein the transfer function Y is:

$$Y = X1\left(-\frac{C1}{C}\right)(1-Z^{-1}) + X2\left(-\frac{C2}{C}\right)$$

wherein X1 and X2 are inputs; $1-Z^{-1}$ is characteristic of input/output relation in the z-domain; C is capacitance of feedback capacitor; C1 is the capacitance of input capacitor in X1 input circuit and C2 is the capacitance of input capacitor in X2 input circuit.

12. The differentiator of claim 8 and further comprising a capacitor in series with said second switch in both of said feedback circuits.

13. A sigma-delta analog to digital converter (FIG. 5) having means forming a forward path including a single ended output type switched capacitor delay circuit ($z^{-1}$) and means forming a feedback path including a switched capacitor differentiator ($1-z^{-1}$).

14. A single ended output switched capacitor delay circuit of claim 13 comprising: an operational amplifier having + and − input terminals, means for providing first and second non-overlapping clocks, a first input circuit to said − terminal of said operational amplifier comprising a capacitor and a first switch wherein said first switch is between said capacitor and said operational amplifier terminal and a second switch between the input node and the capacitor, a second input circuit to said + terminal of said operational amplifier, a first feedback circuit including a capacitor in series with a third switch which is connected to the input circuits between the operational amplifier terminal and the second switch for both + and − input circuits, and a second feedback circuit which is connected to the input circuits between the second switch and the capacitor for both + and − input circuits.

15. A sigma-delta analog to digital converter (FIG. 5) having means forming a forward path including a fully differential output type switched capacitor delay circuit ($z^{-1}$) and means forming a feedback path including a switched capacitor differentiator ($1-z^{-1}$).

16. A fully differential output switched capacitor delay circuit of claim 15 comprising: an operational amplifier, means for providing first and second non-overlapping clocks, an input circuit comprising a capacitor and a first switch wherein said first switch is between said capacitor and said operational amplifier terminal and a second switch between the input node and the capacitor, a first feedback circuit including a capacitor in series with a third switch which is connected to the input circuit between the operational amplifier terminal and the second switch, and a second feedback circuit which is connected to the input circuit between the second switch and the capacitor.

17. The switched capacitor delay of claim 15 comprising a first and a second operational amplifier connected in series; means for providing first and second non-overlapping clocks; an input circuit to said first operational amplifier comprising in series a first switch, a capacitor and a second switch; a feedback circuit for said first operational amplifier including a capacitor in parallel with a third switch synchronized with said second clock; and output circuit for said first operational amplifier which is also the input circuit for said second operational amplifier, which circuit comprises in series a fourth switch, a capacitor and a fifth switch; a feedback circuit for said second operational amplifier including a capacitor in parallel with a sixth switch synchronized with said first clock; and an output circuit for said second operational amplifier which includes a seventh switch synchronized with said second clock.

18. The fully differential output switched capacitor delay of claim 15 comprising:
a first and a second operational amplifier each having + and − terminals and are connected in series;
means for providing first and second non-overlapping clocks; and the following circuits are separately provided and are connected to both the + and − terminals of the two operational amplifiers as follows:
an input circuit to said first operational amplifier comprising in series a first switch, a capacitor and a second switch; a feedback circuit for said first operational amplifier including a capacitor in parallel with a third switch synchronized with said second clock;
an output circuit for said first operational amplifier which is also the input circuit for said second operational amplifier, which circuit comprises in series a fourth switch, a capacitor and a fifth switch; a feedback circuit for said second operational amplifier including a capacitor in parallel with a sixth switch synchronized with said first clock; and an output circuit for said second operational amplifier which includes a seventh switch synchronized with said second clock.

19. A sigma-delta analog to digital converter having means forming a forward path and means forming a feedback path, the feedback path including a switched capacitor differentiator that has the characteristic of input/output relation in the z domain of $1-z^{-1}$.

20. The sigma-delta analog to digital converter of claim 19 further comprising a delay free loop and a transfer relation Y as follows:

$$Y = X + Q\,G(1-Z^{-1})^k$$

where X is the input signal, Q is the quantization error, k is the order of sigma-delta analog to digital converter, and G is the gain.

21. The sigma-delta analog to digital converter of claim 20 wherein the gain, G is greater than or equal to 1 so as to make the circuit stable and having noise power at a reasonable level.

22. The sigma-delta analog to digital converter of claim 19 and further comprising a transfer relation Y as follows:

$$Y = X + Q(1-Z^{-1})^k$$

where X is the input signal, Q is the quantization error, k is the order of sigma-delta analog to digital converter, and the gain, $G=1$.

23. The sigma-delta analog to digital converter of claim 22 and further comprising a switched capacitor delay that has the characteristic of input/output relation in the Z domain as $1-Z^{-1}$.

24. The sigma-delta analog to digital converter of claim 22 and further comprising a delay element $Z^{-1}$ into the forward path of the said analog to digital converter feedback loop.

25. The sigma-delta analog to digital converter of claim 24 and further comprising the transfer relation Y being as follows:

$$Y = X Z^{-1} + Q(1-Z^{-1})^k$$

where X is the input signal, Q is the quantization error, K is the order of sigma-delta analog to digital converter, and the gain, $G=1$.

26. The sigma-delta analog to digital converter of claim 19 and further comprising a delay element $Z^{-1}$ into the feedback loops and a switched capacitor integrator $Z^{-1}/1-Z^{-1}$ term in the forward path of the said analog to digital converter feedback loop.

27. A sigma-delta analog to digital converter (FIG. 6) comprising
means forming a forward path, including a switched capacitor integrator
and means forming a feedback path from the output of the integrator to the input of the integrator, including a switched capacitor differentiator having $1-Z^{-1}$ terms and the transfer relation as follows:

$$Y = X Z^{-1} + Q(1-Z^{-1})^{k1+k2}$$

where X is the input signal, Y is the output signal, Q is the quantization error, k is the order of the sigma-delta analog to digital converter, and the gain, $G,=1$.

28. A sigma-delta analog to digital converter (FIG. 6) comprising
means forming a forward path and a switched capacitor integrator having the transfer function $Z^{-1}/1-Z^{-1}$ connected in the forward path,
means forming a feedback loop and a switched capacitor differentiator having the transfer function $1-Z^{-1}$ and a switched capacitor delay having the transfer function $1-Z^{-1}$ connected in the feedback loop;
and wherein the converter has the transfer relation as follows:

$$Y = X Z^{-1} + Q(1-Z^{-1})^k$$

where X is the input signal, Q is the quantization error, k is the order of the sigma-delta analog to digital converter, and the gain, G,=1.

29. A sigma-delta analog to digital converter (FIG. 5) which includes means forming a feedback path including a switched capacitor differentiator that has the characteristic of input/output relation in the Z domain $1-Z^{-1}$ and means forming a forward path including a switched capacitor delay that has the characteristic of input/output relation in the Z domain $Z^{-1}$.

30. The sigma-delta analog to digital converter of claim 29 wherein the said capacitor differentiator further comprising an operational amplifier, means for providing first and second non-overlapping clocks, an input circuit comprising a capacitor and a first switch synchronized with said second clock wherein said first switch is between said capacitor and said operational amplifier terminal, and a feedback circuit including a capacitor in parallel with a second switch synchronized with said first clock.

31. The differentiator of claim 30 and further comprising an output circuit having a third switch synchronized with said second clock.

32. The differentiator of claim 31 and further comprising signal inversion means for inverting a signal including a second input circuit to said operational amplifier circuit comprising a capacitor and a fourth switch synchronized with said second clock.

33. The differentiator of claim 32 wherein the transfer function Y is:

$$Y = X1\left(-\frac{C1}{C}\right)(1 - Z^{-1}) + X2\left(-\frac{C2}{C}\right)$$

wherein X1 and X2 are inputs; $1-Z^{-1}$ is characteristic of input/output relation in the z-domain; C is capacitance of feedback capacitor; C1 is the capacitance of input capacitor in X1 input circuit and C2 is the capacitance of input capacitor in X2 input circuit.

34. The differentiator of claim 29 and further comprising a capacitor in series with said second switch in said feedback circuit.

35. The sigma-delta analog to digital converter of claim 29 wherein said capacitor differentiator is a fully differentiator output type switched capacitor differentiator comprising an operational amplifier having + and − input and output terminals; means for providing first and second non-overlapping clocks; a first input circuit to said − terminal of said operational amplifier comprising a capacitor and a first switch synchronized with said second clock wherein said first switch is between said capacitor and said operational amplifier terminal, a second input circuit to said + terminal of said operational amplifier comprising a capacitor and a first switch synchronized with said second clock wherein said first switch is between said capacitor and said operational amplifier terminal; and a feedback circuit including a capacitor in parallel with a second switch synchronized with said first clock.

36. The sigma-delta analog to digital converter of claim 29 wherein capacitor delay comprising a fully differential output switched capacitor delay circuit of an operational amplifier, means for providing first and second non-overlapping clocks, an input circuit comprising a capacitor and a first switch wherein said first switch is between said capacitor and said operational amplifier terminal and a second switch between the input node and the capacitor, a first feedback circuit including a capacitor in series with a third switch which is connected to the input circuit between the operational amplifier terminal and the second switch, and a second feedback circuit which is connected to the input circuit between the second switch and the capacitor.

* * * * *